(12) United States Patent
Shimizu

(10) Patent No.: US 6,433,432 B2
(45) Date of Patent: Aug. 13, 2002

(54) SEMICONDUCTOR DEVICE HAVING FLUORINED INSULATING FILM AND REDUCED FLUORINE AT INTERCONNECTION INTERFACES AND METHOD OF MANUFACTURING THE SAME

(75) Inventor: Masayuki Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/753,669

(22) Filed: Jan. 4, 2001

(30) Foreign Application Priority Data

Jul. 31, 2000 (JP) ........................... 2000-232522

(51) Int. Cl.[7] ............................................. H01L 23/52
(52) U.S. Cl. .................... 257/758; 257/751; 438/622
(58) Field of Search .............................. 257/758, 751; 438/787, 622

(56) References Cited

U.S. PATENT DOCUMENTS 5,334,552 A * 8/1994 Homma ..................... 437/195
6,046,502 A * 4/2000 Matsuno .................... 257/751
6,121,162 A * 9/2000 Endo ......................... 438/787
6,127,099 A * 10/2000 Shinohara .................. 430/317

FOREIGN PATENT DOCUMENTS

JP          10-144793          5/1998

* cited by examiner

Primary Examiner—Hoai V. Ho
Assistant Examiner—Tu-Tu Ho
(74) Attorney, Agent, or Firm—Armstrong, Westerman & Hattori, LLP

(57) ABSTRACT

There is provided a semiconductor device which comprises a trench formed in the first insulating film, a metal wiring buried in the trench and having a fluorine concentration on a surface which is lower than an oxygen concentration, a fluorine-noncontaining insulating film formed on the metal wiring, a second fluorine-containing insulating film formed on the metal wiring, holes formed at least in a lower portion of the second fluorine-containing insulating film and the fluorine-noncontaining insulating film on the first metal wiring, and metal plugs buried in the holes.

23 Claims, 19 Drawing Sheets

RE-POLISHING OR (Ar SPUTTER + NH₃ PLASMA)

SEMICONDUCTOR DEVICE HAVING FLUORINED INSULATING FILM AND REDUCED FLUORINE AT INTERCONNECTION INTERFACES AND METHOD OF MANUFACTURING THE SAME

BACKGROUND OF THE INVENTION

1. Field of the Invention

The present invention relates to a semiconductor device and to a method of manufacturing the same and, more particularly, to a semiconductor device having a structure in which plugs or wirings are connected onto a metal pattern buried in a fluorine-containing insulating film and to a method of manufacturing the same.

2. Description of the Prior Art

In recent LSI, in order to achieve the higher speed of LSI, the insulating film between wirings is made of the low dielectric constant material. As such the low dielectric constant material, there is a silicon oxide film in which fluorine or carbon is contained, for example.

The step of connecting a pad to a damascene structure metal wiring formed in an interlayer insulating film containing fluorine will now be explained.

First, as shown in FIG. 1A, a first silicon nitride film 103 is formed on an insulating film 102 made of silicon oxide, etc., formed on a semiconductor substrate 101, and then a first silicon oxide fluoride (SiOF) film 104 is formed thereon.

Then, as shown in FIG. 1B, a wiring trench (recess) 105 is formed by patterning the first SiOF film 104 and the first silicon nitride film 103. In this case, the first silicon nitride film 103 is used as an etching stopper in etching the first SiOF film 104. Then, a first barrier metal film 106 made of tantalum nitride and a first copper film 107 are formed in sequence on an inner surface of the wiring trench 105 and the first SiOF film 104. Then, as shown in FIG. 1C, the first copper film 107 on the first SiOF film 104 and the first barrier metal film 106 are left only in the wiring trench 105 by polishing them by virtue of the CMP method. The first copper film 107 and the first barrier metal film 106 in the wiring trench 105 are used as a wiring 108.

Then, a surface of the wiring 108 is cleaned by the chemicals. Then, as shown in FIG. 1D, a second silicon nitride film 109 and a second SiOF film 110 are formed in sequence on the wiring 108 and the first SiOF film 104. Then, by patterning the second SiOF film 110 and the second silicon nitride film 109 in sequence, a plurality of holes 110a are formed in the lower portion of the second SiOF film 110 and also a pad trench 110b is formed on the holes 110a.

Then, as shown in FIG. 1E, a second barrier metal layer 111 is formed on inner surfaces of a plurality of holes 110a, an inner surface of the pad trench 110b and an upper surface of the second SiOF film 110, and then a second copper film 112 is buried in the holes 110a and the pad trench 110b. Then, the second copper film 112 and the second barrier metal layer 111 are removed from an upper surface of the second SiOF film 110 by polishing them by virtue of the CMP method. Accordingly, the second copper film 112 left in the pad trench 110b is used as a pad electrode 114, and the second copper film 112 left in the holes 110a are used as plugs 113.

After this, as shown in FIG. 1F, a third silicon nitride film 112 is formed on the pad electrode 114 and the second SiOF film 110, and then a protection insulating film 116 is formed on the third silicon nitride film 112.

However, according to the above steps, as shown in FIG. 2, the plugs 113 are peeled off from the upper surface of the wiring 108 after the protection insulating film 116 is formed. In contrast, since such peeling-off of the plugs 113 is not caused when the silicon oxide film is formed in place of the first SiOF film 104, it may be supposed that fluorine contained in the first SiOF film 104 participates in the peeling-off of the plugs 113.

By the way, the event that the metal is degraded when the metal is formed on the fluorine-containing insulating film is set forth in Patent Application Publication (KOKAI) Hei 10-144793. However, since there is no recitation that the plugs are peeled off from the polished metal wiring, the technology set forth in the above Publication cannot be applied to prevent the peeling-off of the plugs from the metal wiring.

SUMMARY OF THE INVENTION

It is an object of the present invention to provide a semiconductor device capable of maintaining good connection between a metal film buried in a trench of a fluorine-containing insulating film and another metal film connected to such metal film, and a method of manufacturing the same.

According to the present invention, after the trench is formed in the fluorine-containing insulating film, then the metal film is formed in the trench and on the fluorine-containing insulating film, and then the metal film is polished to remove from the fluorine-containing insulating film but leave in the trench, the fluorine stuck onto the surface of the metal film can be reduced.

Accordingly, after the fluorine-noncontaining insulating film, e.g., the silicon nitride film, the silicon carbide film, or the silicon oxide film is formed on the metal film buried in the trench and then the metal plugs that penetrate the fluorine-noncontaining insulating film are connected to the upper surface of the metal film, the situation that the fluorine-noncontaining insulating film is never peeled off from the metal film or the metal plugs are never separated from the metal film can be eliminated. Thus, the adhesiveness between the fluorine-noncontaining insulating film and the metal film can be improved and the connection between the metal film and the metal plugs is good.

If an amount of the fluorine on the surface of the metal film buried in the trench in this manner is reduced to less than 60% of that obtained when the surface of the copper wiring is cleaned, more preferably, less than 3.9 atom %, the adhesiveness between the metal film and the metal plugs or the metal film and the overlying fluorine-noncontaining insulating film can be improved.

DETAILED DESCRIPTION OF THE PREFERRED EMBODIMENTS

Embodiments of the present invention will be explained with reference to the accompanying drawings hereinafter.

(First Embodiment)

FIGS. 3A to 3K are sectional views showing steps of manufacturing a semiconductor device according to a first embodiment of the present invention.

Figure 3A:
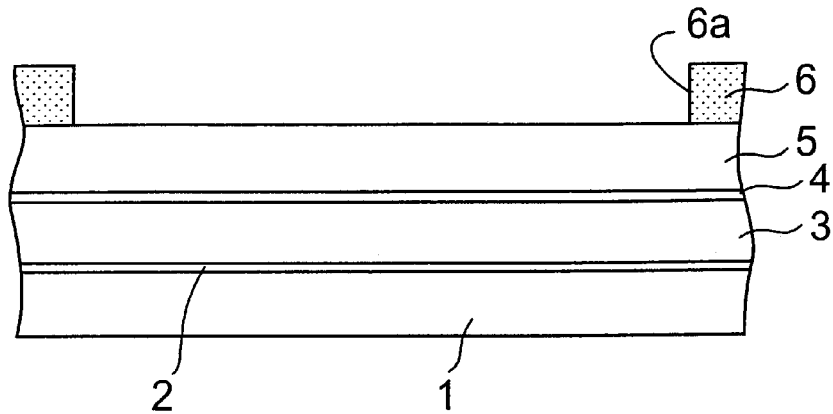
FIGS. 3A to 3K are sectional views showing steps of manufacturing a semiconductor device according to a first embodiment of the present invention.

First, as shown in FIG. 3A, a protection insulating film 2 made of silicon dioxide, silicon nitride, silicon nitride oxide, or the like is formed on a silicon (semiconductor) substrate 1 on which a device isolation structure and transistors (not shown) are formed, and then a single layer or plural-layered interlayer insulating film 3 is formed thereon. As the interlayer insulating film 3, insulating material such as BPSG, silicon oxide, SiOF, or the like is employed.

Then, a first silicon nitride ($Si_3N_4$) film 4 of 30 nm thickness is formed on the interlayer insulating film 3 by the CVD method, and also a first SiOF film 5 of 500 nm thickness is formed on the first silicon nitride film 4 by the CVD method. It is preferable that a concentration of the fluorine contained in the first SiOF film (fluorine-containing insulating film) 5 should be set to 10 wt %, for example, to reduce the dielectric constant.

Then, a window 6a having a wiring shape is formed by coating resist 6 on the first SiOF film 5 and then exposing/developing the resist 6. Then, a wiring trench 7 that reaches the first silicon nitride film 4 is formed by dry-etching the first SiOF film 5 via the window 6a in the resist 6 in the etching atmosphere, in which a $C_4F_8$ gas, an Ar gas, and an $O_2$ gas are introduced at flow rates of 5 to 15 cc/min, 300 cc/min, and 5 cc/min respectively, and under the condition of the applied power of 600 W. In this case, the first silicon nitride film 4 functions as the etching stopper and thus variation in depth of the wiring trench 7 does not substantially occur. In addition, the wiring trench 7 is deepened by etching the first silicon nitride film 4 via the window 6a in the resist 6. In this case, the interlayer insulating film 3 is also etched slightly.

Figure 3B:
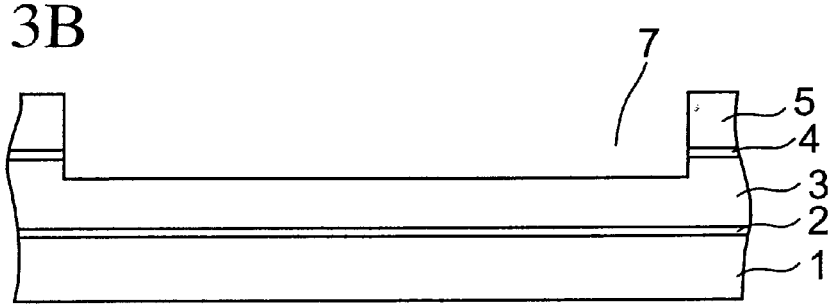

Then, a shape shown in FIG. 3B is obtained by removing the resist 6.

Figure 3C:
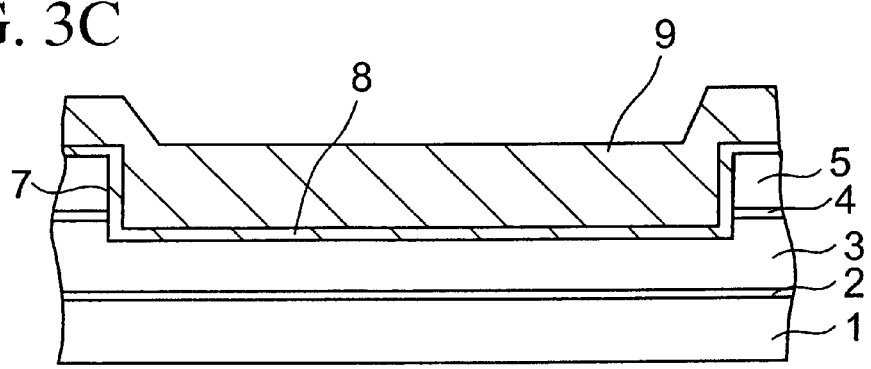

Then, as shown in FIG. 3C, a first tantalum nitride (TaN) film 8 of 25 nm thickness is formed on an inner surface of the wiring trench 7 and the first SiOF film 5 by the sputter method. Then, a thin copper seed layer (not shown) is formed on the first tantalum nitride film 8 by the sputter method. Then, a first copper (Cu) film 9 having a thickness that can bury completely the wiring trench 7, e.g., 1300 nm, is formed on the first tantalum nitride film 8 by the electrolytic plating method using the copper seed layer as the growth core. In this case, the first tantalum nitride film 8 acts as the barrier metal for the first copper film 9.

Figure 3D:
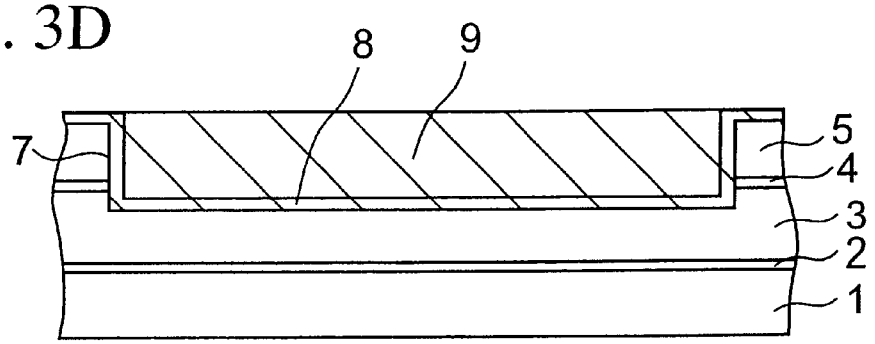
Figure 3E:
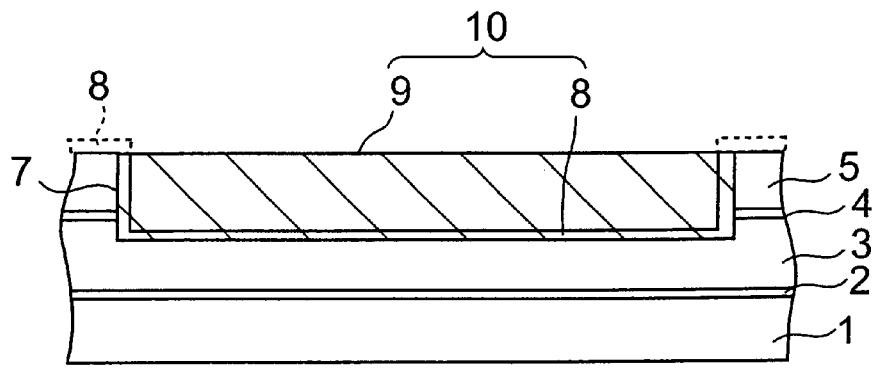

Then, as shown in FIG. 3D, the first copper film 9 is left only in the wiring trench 7 by polishing it by means of the CMP method using slurry A. Then, as shown in FIG. 3E, the first tantalum nitride film 8 is polished by the CMP method using slurry B. Since surfaces of an copper oxide formed on a surface of the first copper film 9 and the first SiOF film 5 are also polished in polishing the first tantalum nitride film 8, fluorine (F) contained in the first SiOF film 5 is adhered onto the surface of the first copper film 9.

Here, the slurry A contains a phosphoric acid group ammonia solution, a citric acid group ammonia solution, an antiseptic solution, and hydrogen peroxide, while the slurry B contains an alkaline solution whose PH is adjusted near 10.

The first tantalum nitride film 8 and the first copper film 9 that are left in the wiring trench 7 by such CMP method are used as a copper wiring 10.

Figure 3F:
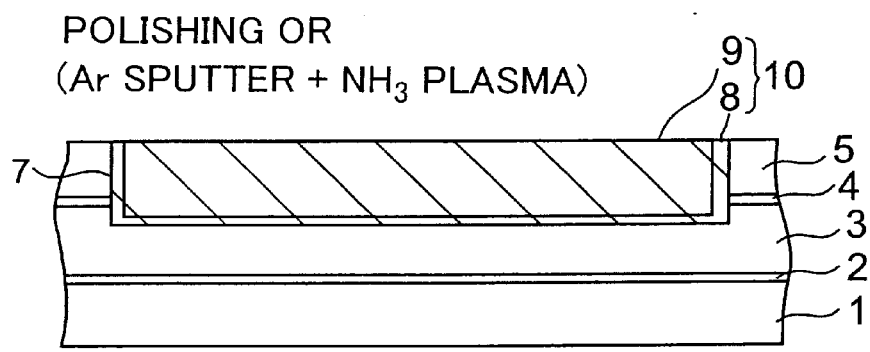

Then, after the CMP step using the slurry B is completed, any one of following two methods will be applied to remove the fluorine adhered to the surface of the copper wiring 10 after the surface is cleaned, as shown in FIG. 3F.

A first method is that, after the first tantalum nitride film 8 is removed from the surface of the first SiOF film 5 by using the slurry B, the first copper film 9 is polished by the CMP method using the slurry A once again.

A second method is that first the surface of the first copper film 9 is etched up to 5 nm in terms of the film thickness of the silicon oxide film, for example, by the argon sputter after the first tantalum nitride film 8 is polished by the CMP method, and then the surface of the first copper film 9 is exposed to the ammonia (NH$_3$) plasma. According to the ammonia plasma, copper oxide (CuO$_X$) on the surface of the first copper film 9 is reduced and also the fluorine is sublimated as hydrogen fluoride. As the conditions for the argon sputter, for example, a flow rate of the argon gas introduced into the sputtering equipment is set to 4 to 5 cc/min, an applied power is set to 400 kW, a degree of vacuum in the equipment is set to 0.5 mTorr. Also, as the conditions of the ammonia plasma, for example, in the parallel plate type plasma generator, a flow rate of the ammonia gas introduced into the equipment is set to 3850 cc/min, a flow rate of the nitrogen gas is set to 2800 cc/min, a degree of vacuum in the equipment is set to 2.2 Torr, and an electrode applied power is set to 560 kW.

If any one of these methods is employed, the fluorine is almost removed from the surface of the first copper film 9 constituting the copper wiring 10. Details of these two methods will be described later.

After this, the process goes to the steps of forming the copper pads on the copper film by the dual damascene method.

Figure 3G:
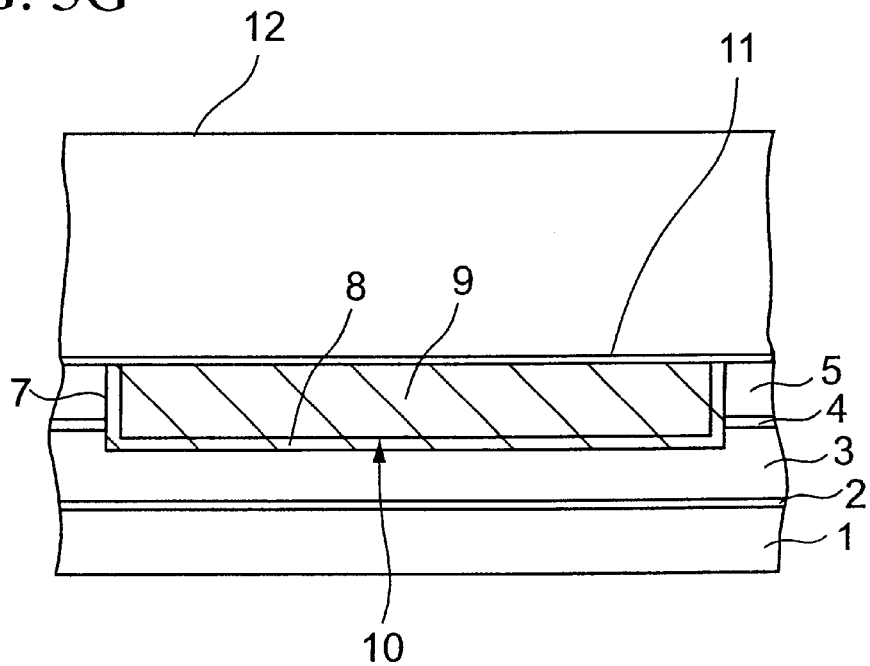

First, as shown in FIG. 3G, a second silicon nitride film (fluorine-noncontaining insulating film) 11 of 70 nm thickness is formed on the copper wiring 10 and the first SiOF film 5 by the CVD method. Then, a second SiOF film (fluorine-containing insulating film) 12 of 1700 nm thickness is formed on the second silicon nitride film 11 by the CVD method. In this case, a silicon carbide film may be formed in place of the second silicon nitride film 11.

Figure 3H:
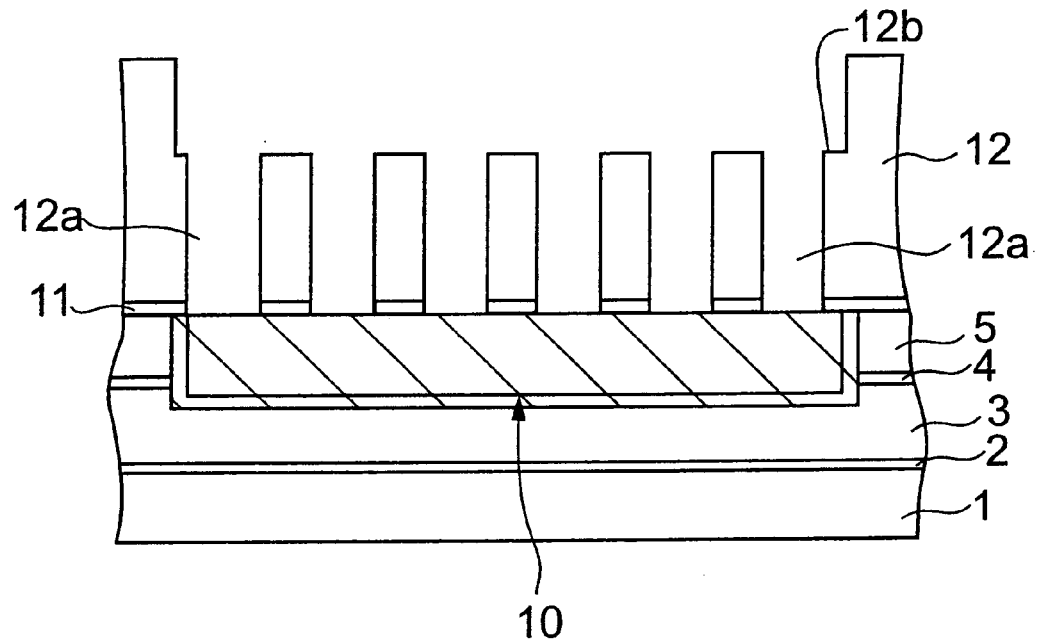

Next, steps required to get the structure shown in FIG. 3H will be explained hereunder.

First, a plurality of holes 12a are formed in a pad forming region by patterning the second SiOF film 12 and the second silicon nitride 11. Then, organic insulating material (not shown) is stacked on the bottom of the holes 12a, and then a pad trench 12b is formed in the upper area of the second SiOF film 12 by patterning the second SiOF film 12 again by virtue of the photolithography method. Accordingly, a plurality of holes 12a is formed under the pad trench 12b to project toward the copper wiring 10. The organic insulating material is removed together with the resist used in the photolithography method.

Figure 3I:
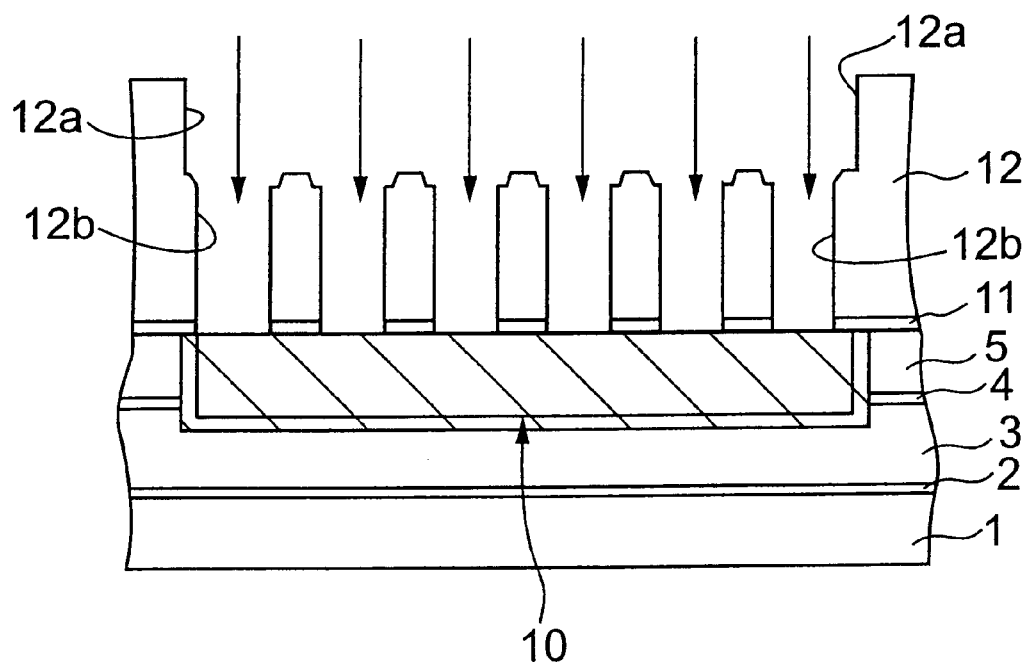

In turn, as shown in FIG. 3I, the oxide film formed on the surface is removed by etching the surface of the copper wiring 10 via a plurality of holes 12a by virtue of the sputter. In this case, shoulder portions of the second SiOF film 12 around the holes 12a are obliquely scraped off to expand a diameter of the holes 12a in the neighborhood of the pad trench 12b.

Then, a second tantalum nitride film 13 is formed on inner surfaces of the pad trench 12b and the holes 12a and a surface of the second SiOF film 12. Then, a second copper film 14 is formed on the second tantalum nitride film 13 to have a thickness that can perfectly cover the pad trench 12b. The second copper film 14 is formed by the electrolytic plating method after a copper seed film (not shown) is formed on the second tantalum nitride film 13.

Figure 3J:
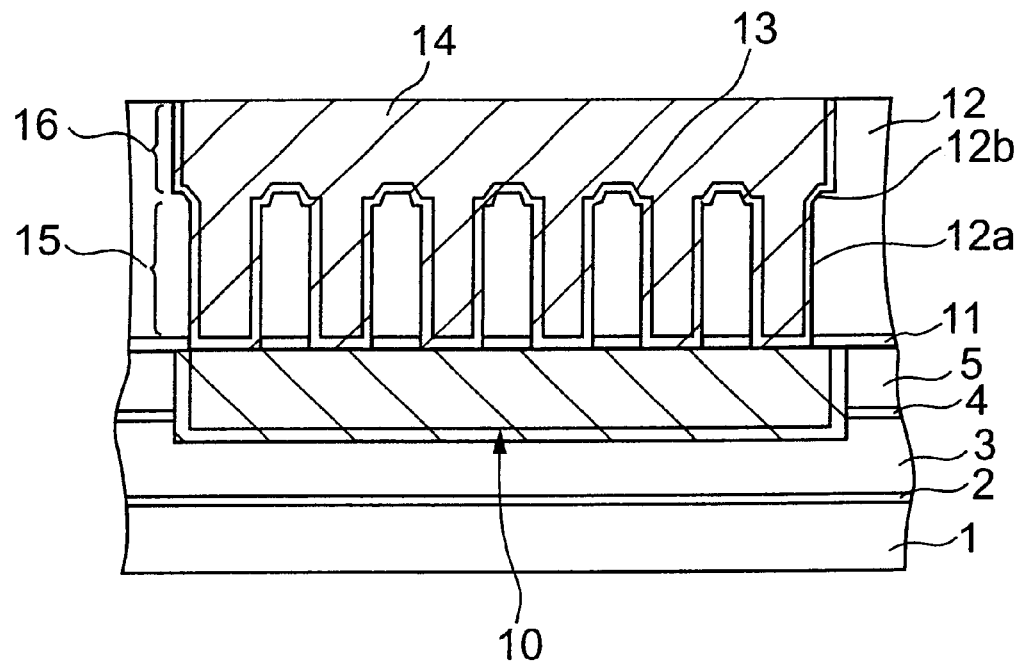

Then, as shown in FIG. 3J, the second copper film 14 is left only in the pad trench 12b and the holes 12a by polishing it by the CMP method using the slurry A. Then, the second tantalum nitride film 13 formed on the second SiOF film 12 is removed by the CMP method using the slurry B.

Accordingly, the second copper film 14 and the second tantalum nitride film 13 left in the holes 12a are used as plugs 15, and the second copper film 14 left in the pad trench 12b is used as a pad 16.

Figure 3K:
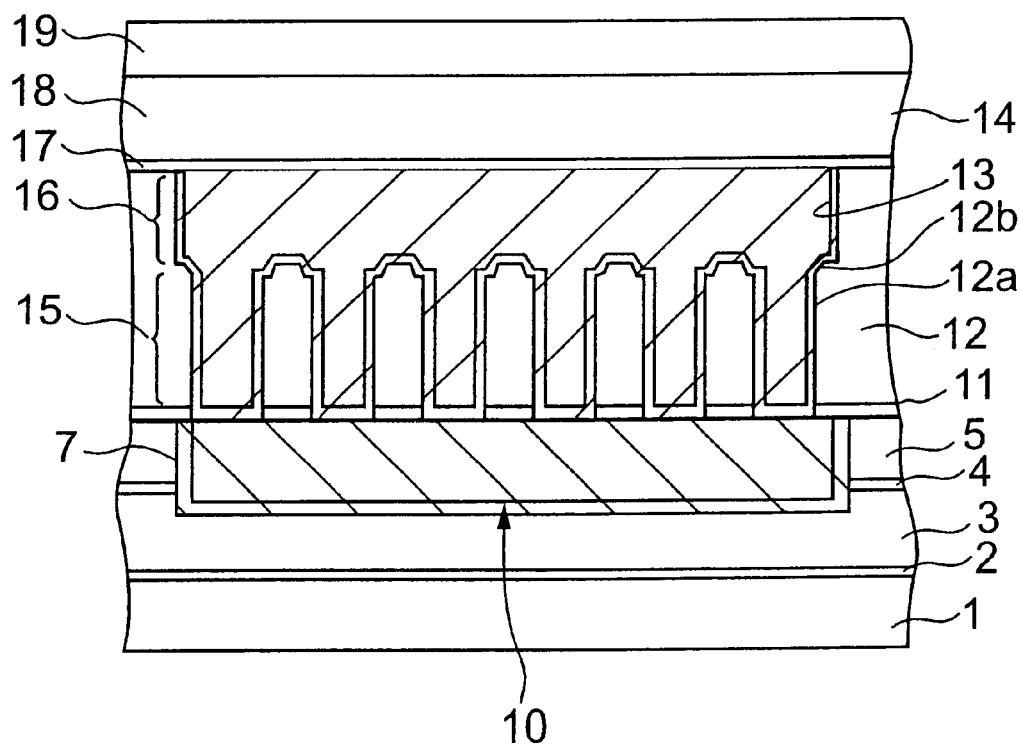

Next, steps required to get the structure shown in FIG. 3K will be explained hereunder.

First, a third silicon nitride film 17 of 70 nm thickness is formed on the pad 16 and the second SiOF film 12 by the CVD method. Then, a first cover film 18 formed of silicon oxide to have a thickness of 400 nm and a second cover film 19 formed of silicon nitride to have a thickness of 300 nm are formed on the third silicon nitride film 17 by the CVD method at the substrate temperature of about 400° C. respectively.

As described above, when the fluorine on the surface of the copper wiring 10 is removed by the above method after the copper wiring 10 is formed by polishing the first copper film 9 and the first tantalum nitride film 8 by means of the CMP method, no peeling-off is caused between the copper wiring 10 and the overlying plugs 15 after the first cover film 18 and the second cover film 19 are formed.

Next, the peeling-off of the plugs 15 from the copper wiring 10 will be explained hereunder.

The inventors of the present invention have performed the experiment described in the following.

Figure 4:
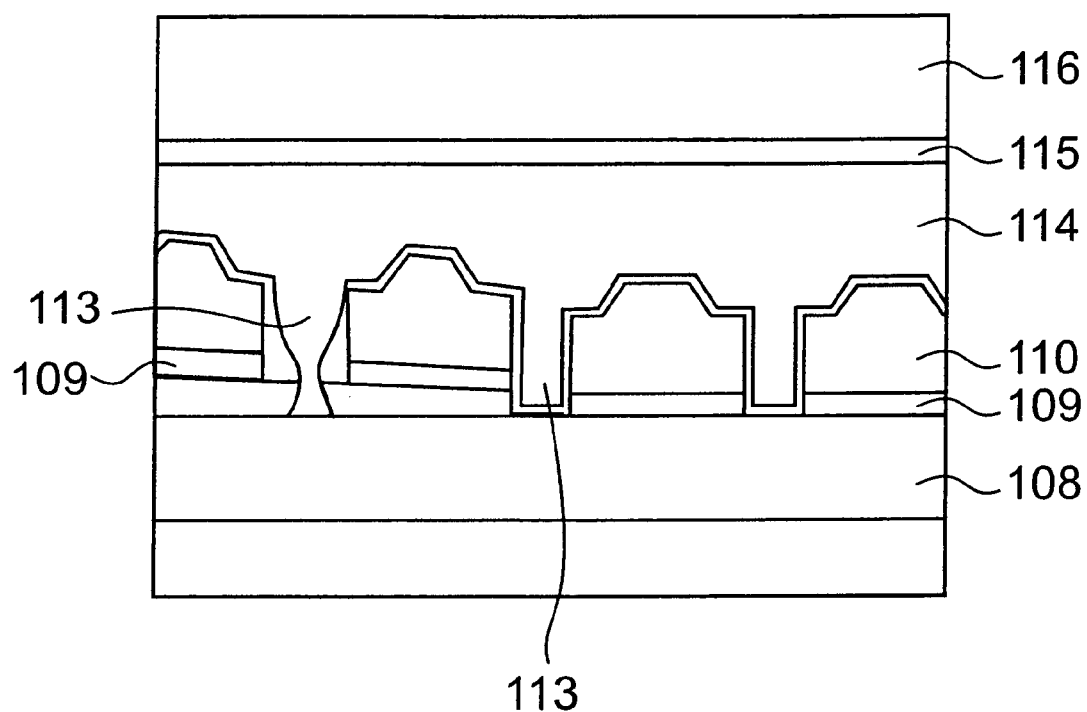
FIG. 4 is a sectional view, depicted based on a microphotograph, showing contact defect between plugs and a wiring of the semiconductor device formed by the steps in the prior art.

First, the prior art will be explained. That is, in the prior art, the copper wiring 108 is formed, then the surface of the copper wiring 108 is cleaned, and then the silicon nitride film 109, the SiOF film 110, the plugs 113, the pad 114, the silicon nitride film 115 and the cover film 116 are formed in sequence on the copper wiring 108. In the worst case, as shown in FIG. 4, the plugs 113 and the silicon nitride film 109 are lifted from the copper wiring 108 and thus the plugs 113 and the copper wiring 108 are brought into their disconnected state. In this case, FIG. 4 is a sectional microphotograph of the semiconductor device depicted as a diagram.

Figure 5:
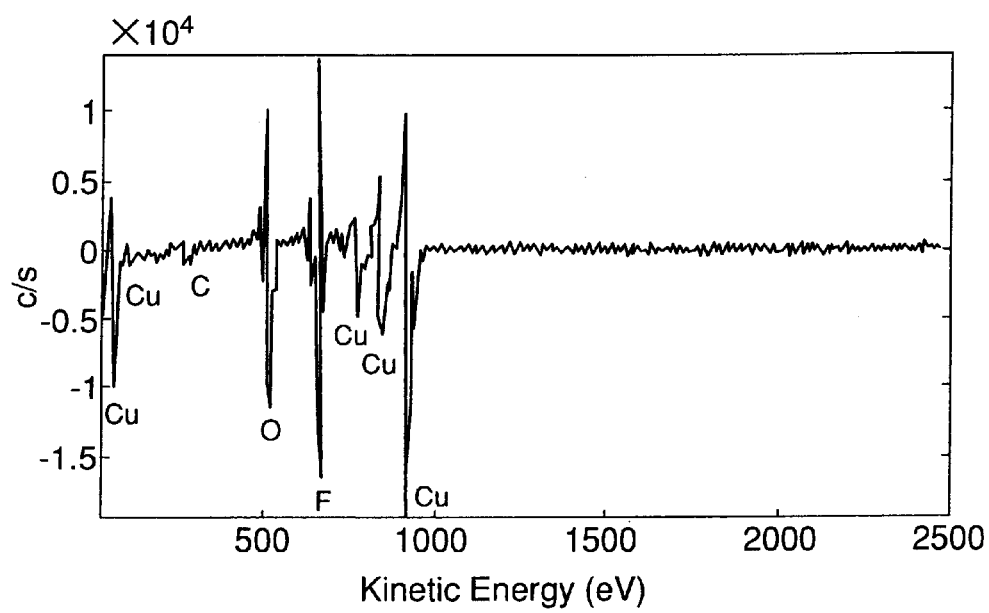
FIG. 5 is an analysis diagram showing an element amount on a surface of the copper wiring after the copper wiring is formed in the fluorine-containing insulating film and then the surface is wet-cleaning.
Figure 6:
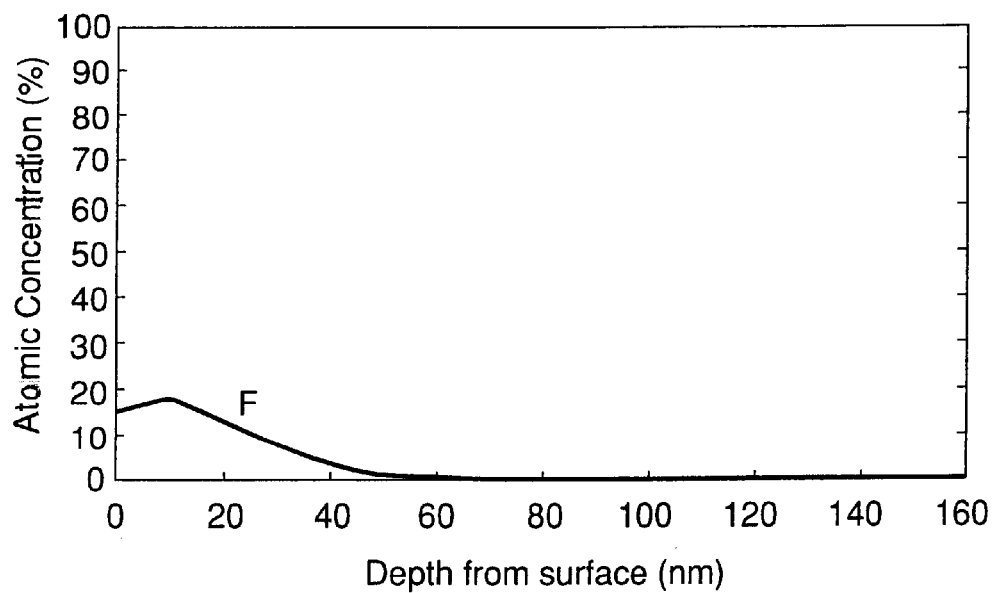
FIG. 6 is a diagram showing a distribution of the fluorine in the copper wiring in the depth direction after the copper wiring is formed in the fluorine-containing insulating film and then the surface is wet-cleaning.

When an elemental analysis of elements existing on the surface is performed after the surface of the copper wiring 108 is cleaned, an analysis result shown in FIG. 5 can be derived. According to FIG. 5, it becomes apparent that a great deal of fluorine exists on the surface of the copper wiring 108. It may be guessed that the fluorine appeared in FIG. 5 is linked to the copper element and oxygen is also linked to the copper element. Then, when a distribution of the fluorine in the cleaned copper wiring 108 in the depth direction is examined, the result shown in FIG. 6 is derived. The fluorine is present from the surface of the copper wiring 108 to a depth of about 50 nm while being reduced.

Figure 1A:
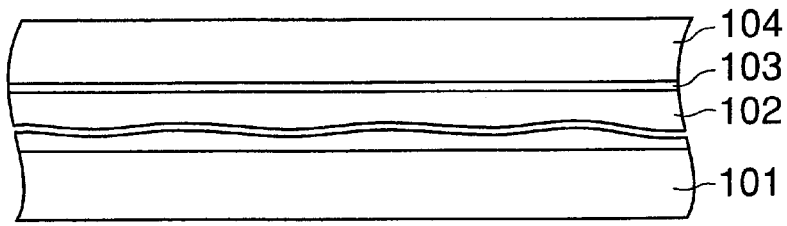
FIGS. 1A to 1F are sectional views showing steps of forming a copper wiring having a damascene structure and a copper pad in the prior art.
Figure 1B:
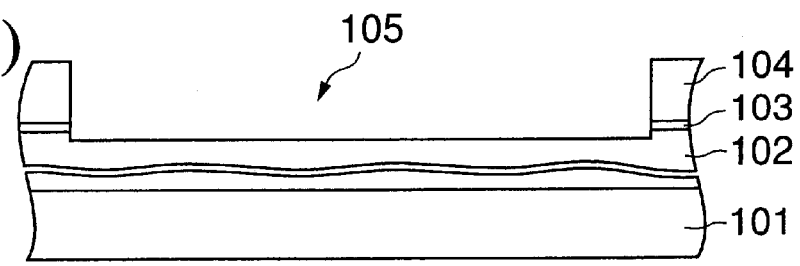
Figure 1C:
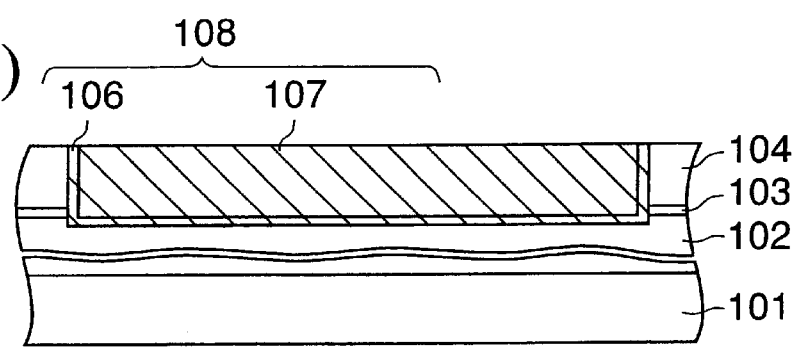
Figure 1D:
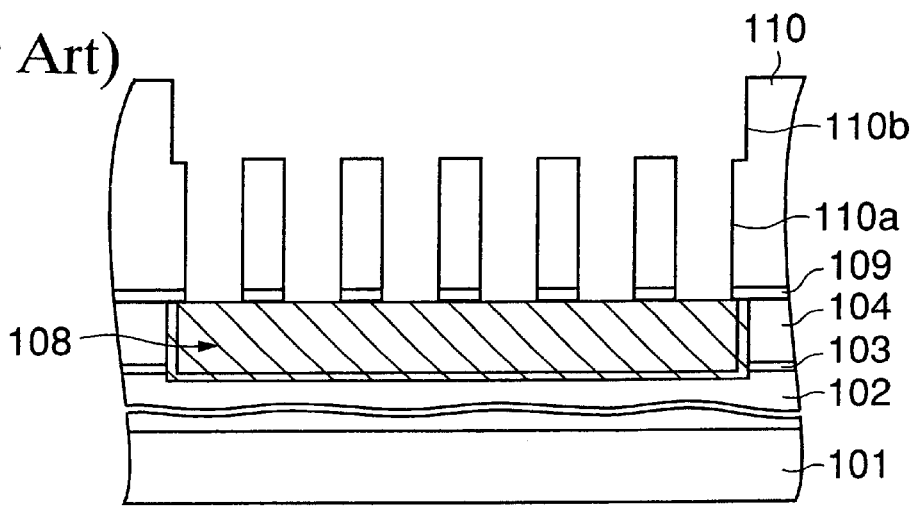
Figure 1E:
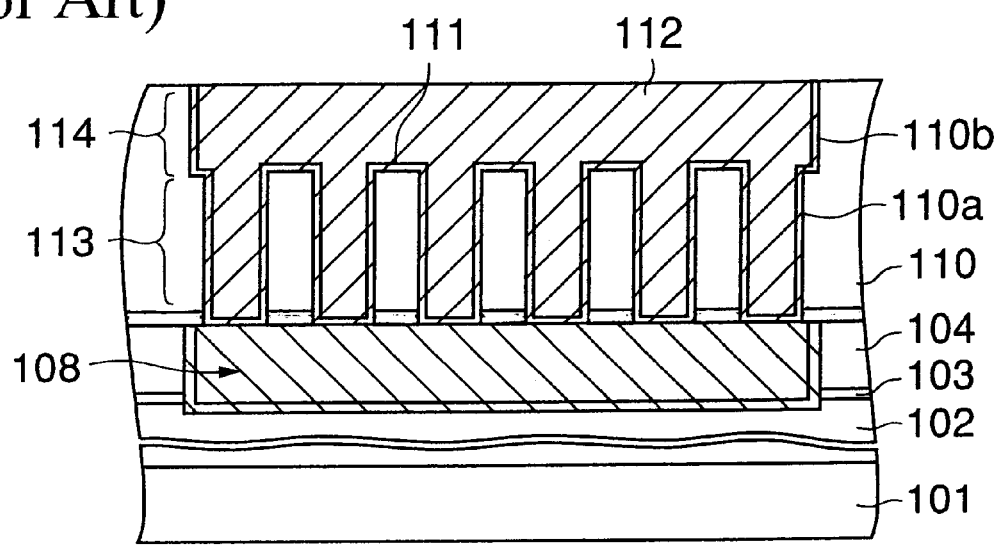
Figure 1F:
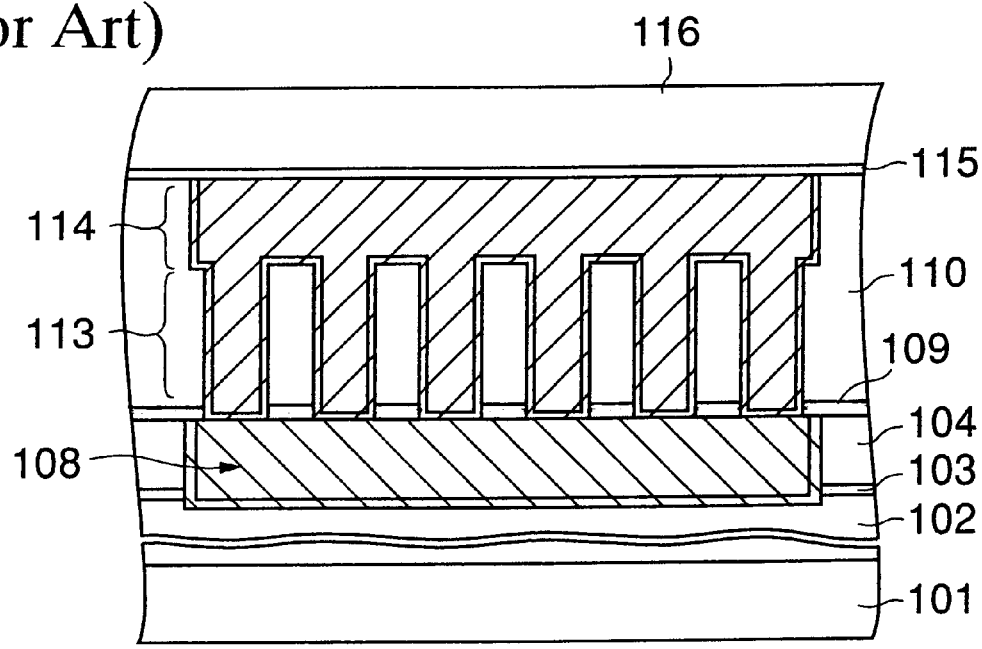
Figure 2:
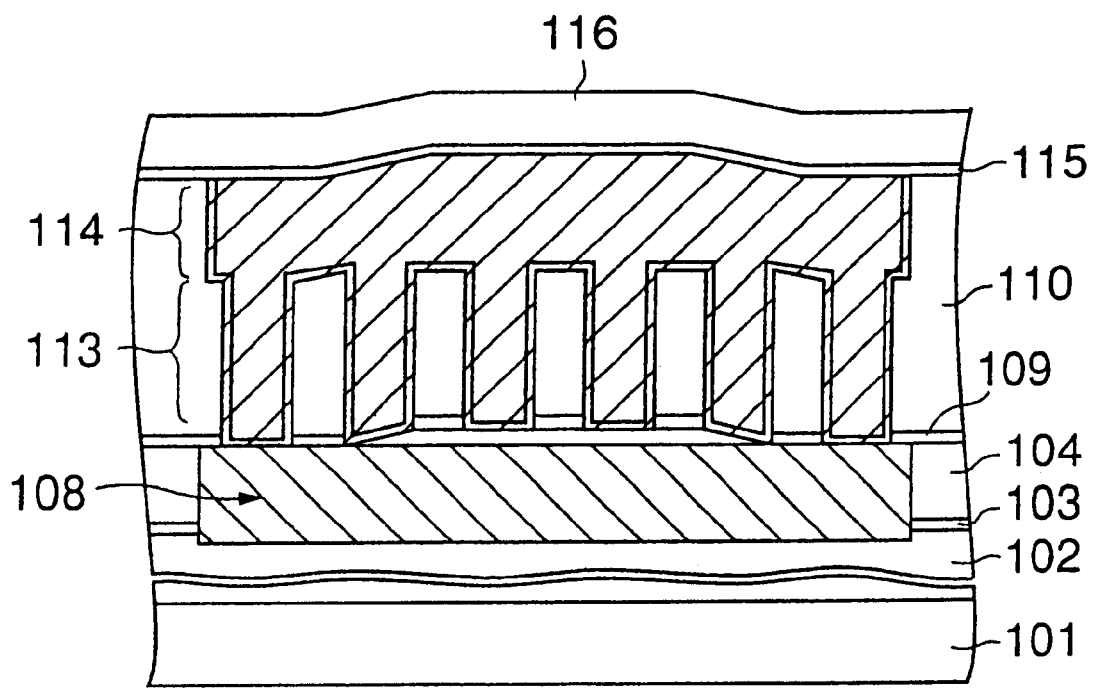
FIG. 2 is a sectional view showing contact defect between the copper pad and the copper wiring caused by the steps shown in FIGS. 1A to 1F in the prior art.

Meanwhile, as shown in FIG. 1C, since the first copper film 107 is formed on the tantalum nitride film 106, the fluorine is never mixed into the first copper film 107 at the time of formation of the first copper film 107. As a result, it may be concluded that the fluorine escaped from the first SiOF film 104 that is polished together with the first tantalum nitride film 106 is stuck onto the surface of the copper wiring 108.

Then, the copper wiring 10 is formed as shown in FIG. 3E, then the surface is cleaned, and then the surface of the copper wiring 10 is scraped off by the argon sputter. Then, as described above, the silicon nitride film 11 and the SiOF film 12 are formed on the copper wiring 10, then the holes 12a and the pad trench 12b are formed in the silicon nitride film 11 and the SiOF film 12, and then the plugs 15, the pad 16, the silicon nitride film 17, and the cover films 18, 19 are formed in sequence. In the worst case, the plugs 15 are lifted from the copper wiring 10 and thus the contact between them is almost disconnected.

Figure 7:
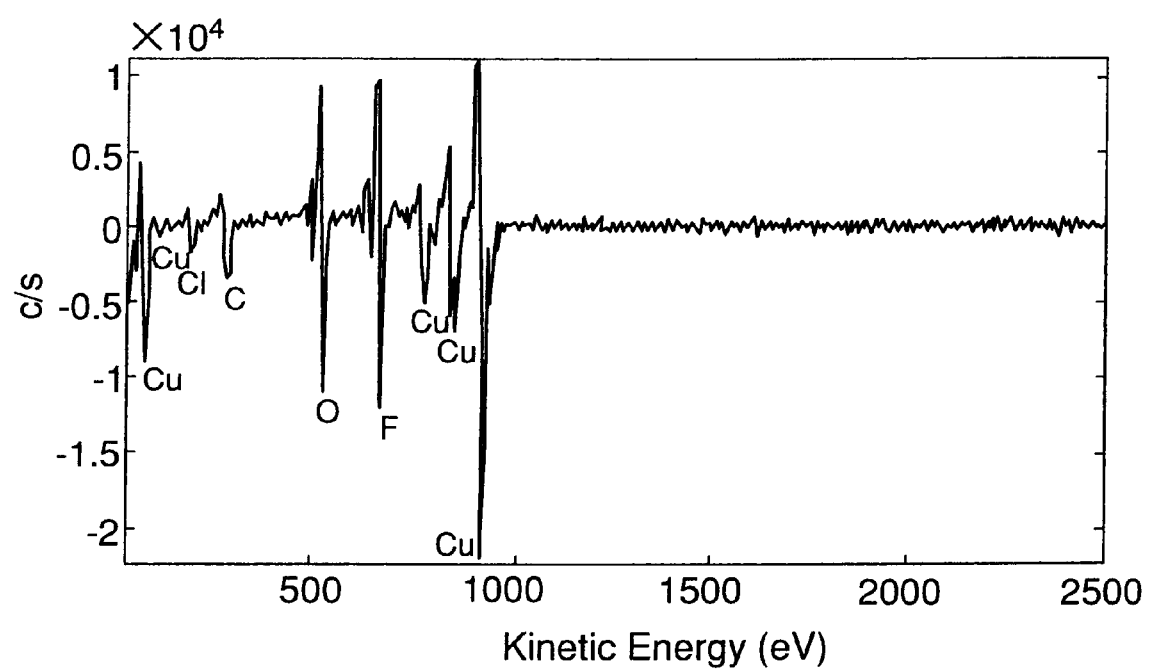
FIG. 7 is an analysis diagram showing an element amount on the surface of the copper wiring after the copper wiring is formed in the fluorine-containing insulating film and then the surface is sputtered by an argon.

After the surface of the copper wiring 10 is cleaned and then the copper wiring 10 is etched by the argon sputter up to a depth of 5 nm in terms of the thickness of the silicon oxide film, the elemental analysis of the elements existing on the surface is performed. At this time, the analysis result shown in FIG. 7 has been derived. According to FIG. 7, it becomes apparent that the fluorine exists on the surface of the copper wiring 10, but an amount of the fluorine can be reduced to 60% rather than the case shown in FIG. 5.

Figure 8:
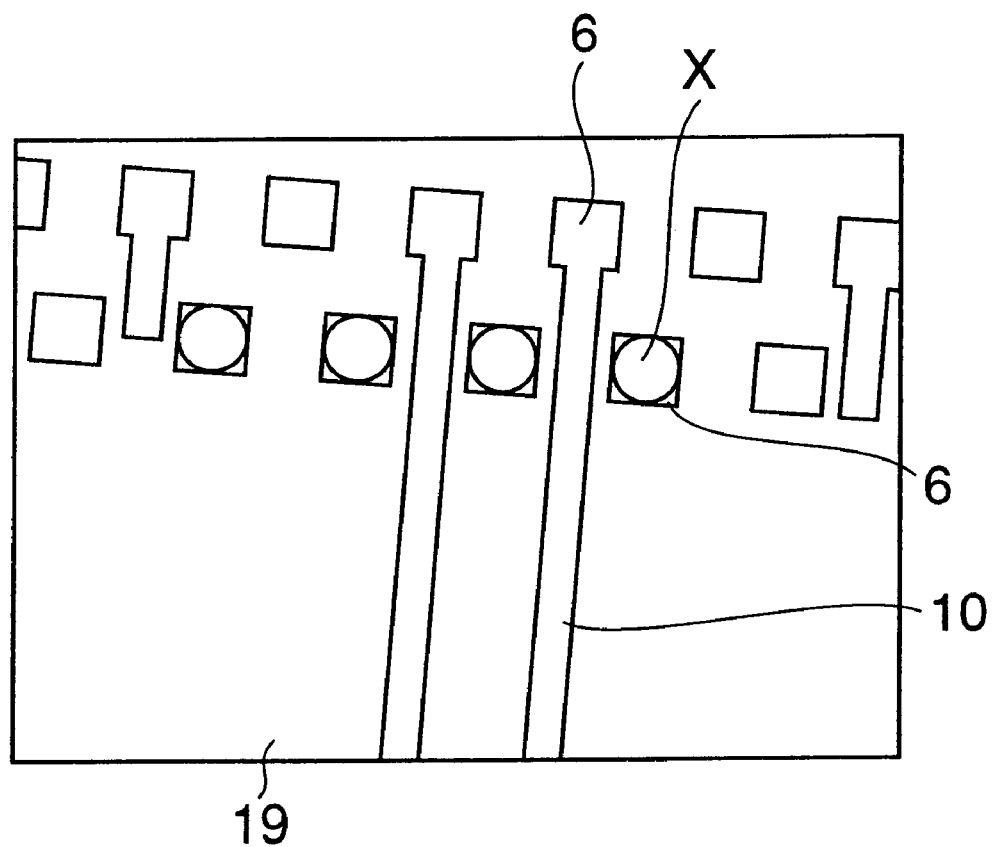
FIG. 8 is a plan view showing the state of pads and wirings of the semiconductor device that is formed via steps of forming the copper wiring in the fluorine-containing insulating film, then exposing the surface to the ammonia plasma, and then forming an insulating film on the copper wiring.

Then, the copper wiring 10 is formed as shown in FIG. 3E, then the surface is cleaned, and then the copper wiring 10 is exposed to the ammonia plasma. Then, as described above, the silicon nitride film 11 and the SiOF film 12 are formed on the copper wiring 10, then the holes 12a and the pad trench 12b are formed in the silicon nitride film 11 and the SiOF film 12, and then the plugs 15, the pad 16, the silicon nitride film 17, and the cover films 18, 19 are formed in sequence. In the worst case, the plugs 15 are lifted from the copper wiring 10 and thus the contact between them is almost disconnected. Also, when upper surfaces of the pads 16 and the wiring 10 are checked after the second cover film 19 is formed, a planar shape of the second cover film 19 appears, as shown in FIG. 8, and also an expanded portion X is present in the pad 16. In this case, even if the silicon carbide film is formed in place of the silicon nitride film 11 that covers the copper wiring 10, generation of the expanded portion X, i.e., peeling-off of the copper wiring 10 and the silicon carbide film cannot be prevented. For this reason, this is similarly true of the case where other silicon compound insulating film is used in place of the silicon nitride film 11.

Figure 9:
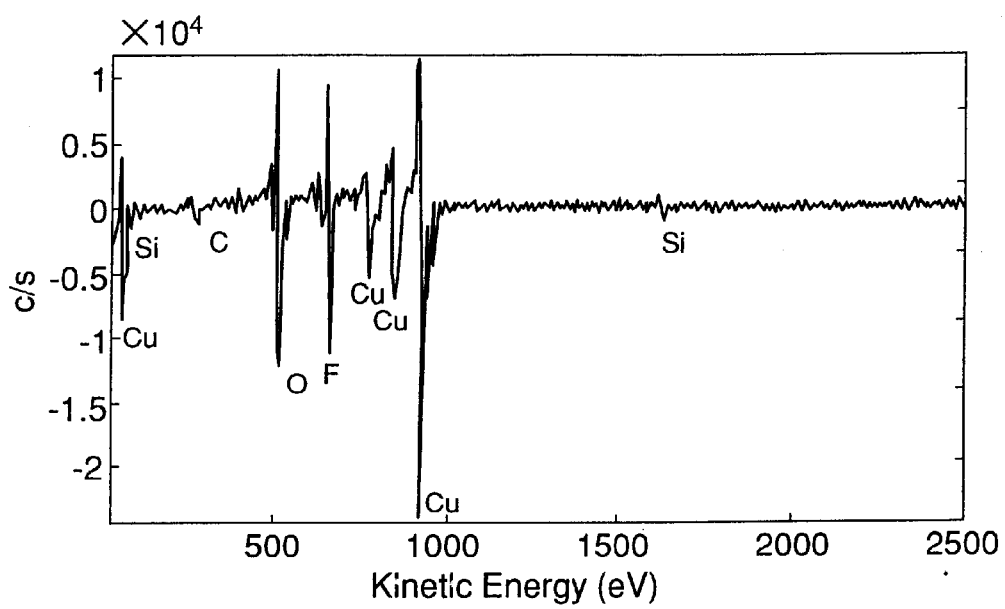
FIG. 9 is an analysis diagram showing an element amount on the surface of the copper wiring after the copper wiring is formed in the fluorine-containing insulating film and then the surface is exposed to the ammonia plasma.
Figure 10:
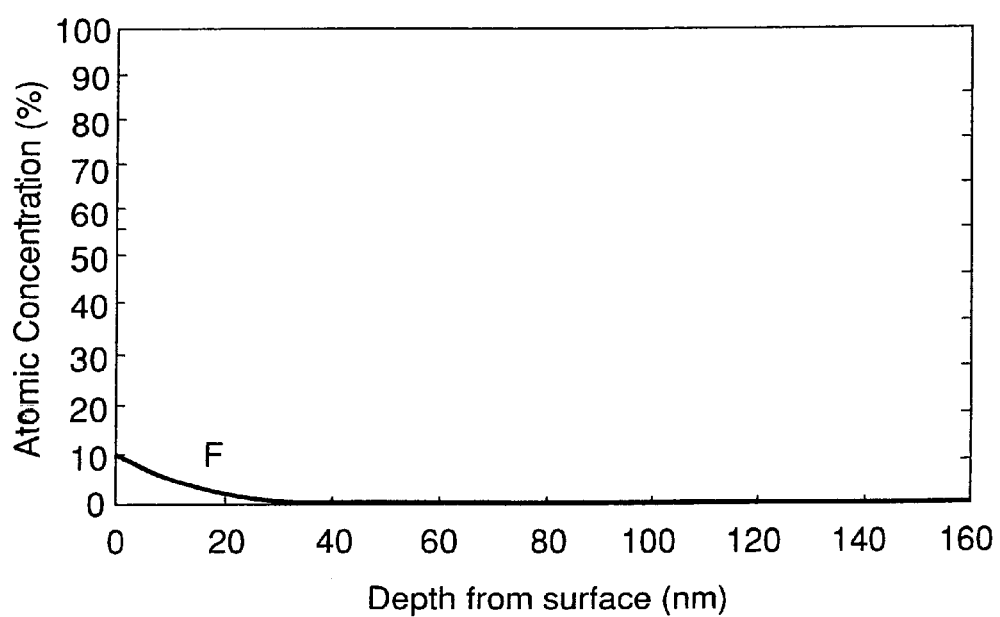
FIG. 10 is a diagram showing a distribution of the fluorine in the copper wiring in the depth direction after the copper wiring is formed in the fluorine-containing insulating film and then the surface is exposed to the ammonia plasma.

After the surface of the copper wiring 10 is cleaned and then the copper wiring 10 is exposed to the ammonia plasma, the elemental analysis of the elements existing on the surface is performed. At this time, the analysis result shown in FIG. 9 has been derived. According to FIG. 9, it is apparent that the fluorine exists on the surface of the copper wiring 10, but an amount of the fluorine can be reduced to 60% rather than the case shown in FIG. 5. In addition, when a distribution of the fluorine in the copper wiring in the depth direction after the copper wiring is exposed to the ammonia plasma, the result shown in FIG. 10 can be obtained. The fluorine is present from the surface of the copper wiring 10 to a depth of about 30 nm while being reduced.

Figure 11:
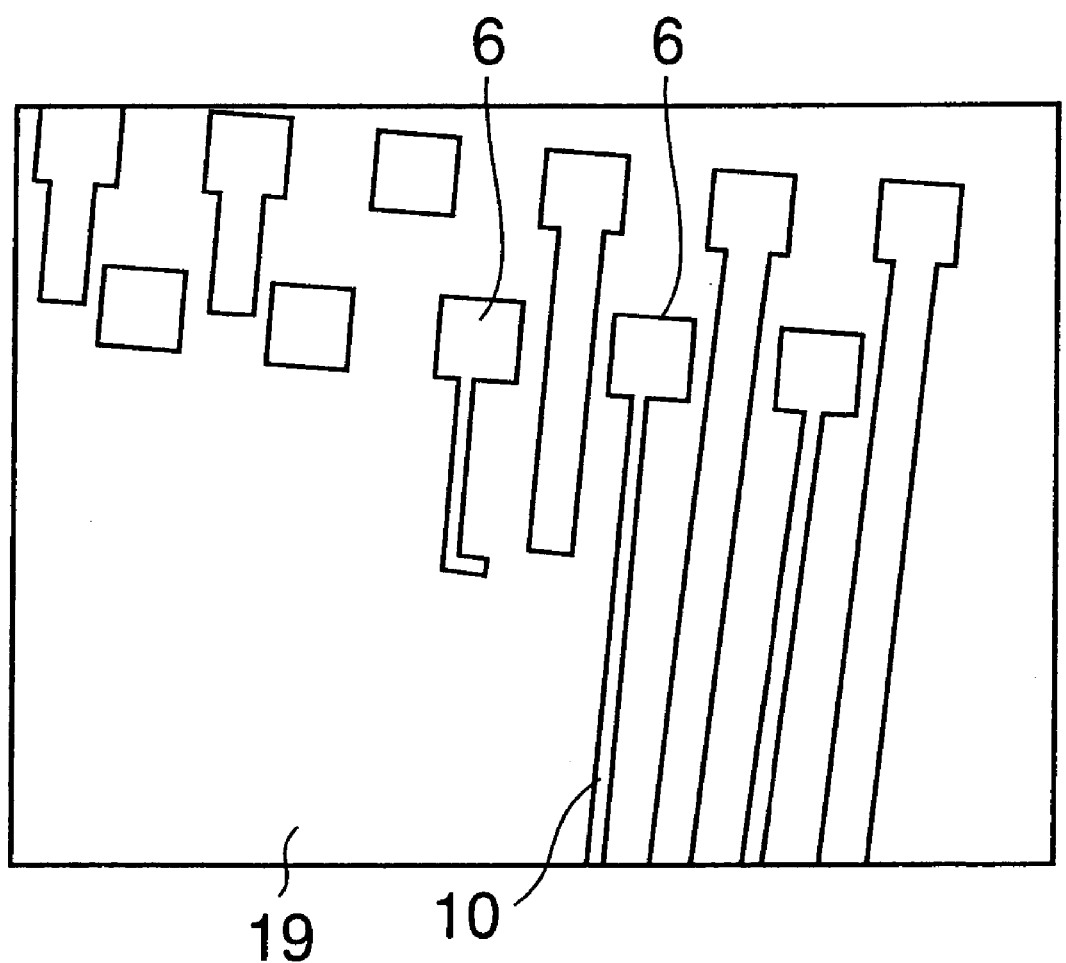
FIG. 11 is a plan view showing the state of pads and wirings of the semiconductor device that is formed via steps of forming the copper wiring in the fluorine-containing insulating film, then sputtering the surface by the argon, then exposing the surface to the ammonia plasma, and then forming the insulating film on the copper wiring.

Then, the copper wiring 10 is formed as shown in FIG. 3E, then the surface is cleaned, then the copper wiring 10 is etched by the argon sputter up to a depth of 5 nm, and then the copper wiring 10 is exposed to the ammonia plasma. Then, as described above, the silicon nitride film 11 and the SiOF film 12 are formed on the copper wiring 10, then the holes 12a and the pad trench 12b are formed in the silicon nitride film 11 and the SiOF film 12, and then the plugs 15, the pad 16, the silicon nitride film 17, and the cover films 18, 19 are formed in sequence. At this time, the plugs 15 are never lifted from the copper wiring 10 and thus an ideal sectional shape can be obtained. Also, when the upper surfaces of the pads 16 and the copper wiring 10 are checked after the second cover film 19 is formed, a planar shape of the second cover film 19 shown in FIG. 11 appears and the upper surfaces of the pads 16 become a flat surface and thus becomes the normal state. In this case, because the flatness of the upper surface of the pad 16 is not lost even if the silicon carbide film is formed in place of the silicon nitride film for covering the copper wiring 10, it is possible to say that, even if other silicon compound insulating film is used in place of the silicon nitride film 11, the peeling-off is never caused between the copper wiring 10 and the overlying insulating film.

Figure 12:
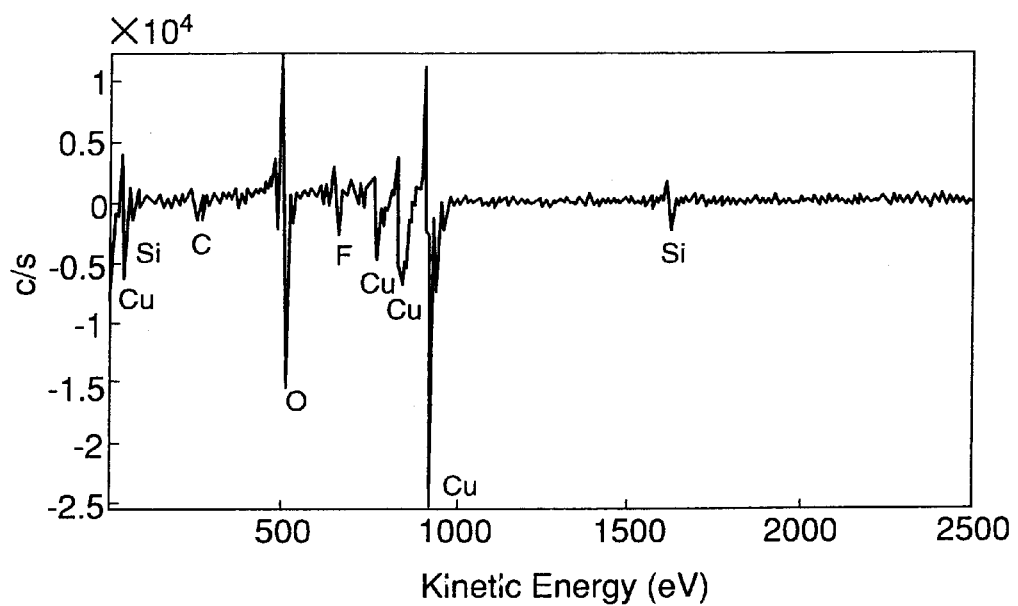
FIG. 12 is an analysis diagram showing an element amount on the surface of the copper wiring after the copper wiring is formed in the fluorine-containing insulating film, then the surface is sputtered by the argon, and then the surface is exposed to the ammonia plasma.
Figure 13:
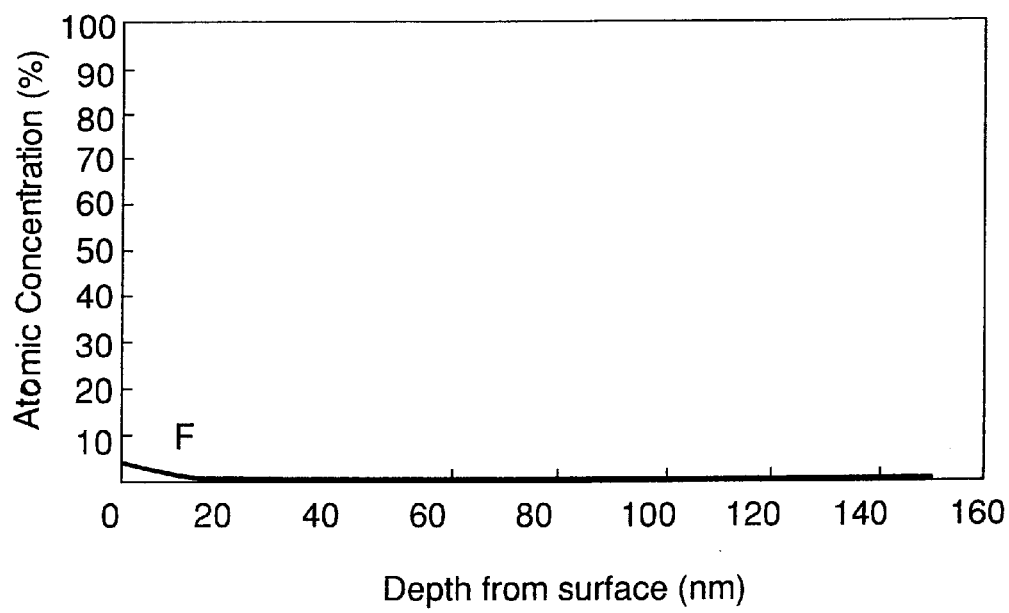
FIG. 13 is a diagram showing a distribution of the fluorine in the copper wiring in the depth direction after the copper wiring is formed in the fluorine-containing insulating film, then the surface is sputtered by the argon, and then the surface is exposed to the ammonia plasma.

After the surface of the copper wiring 10 is cleaned and then the copper wiring 10 is exposed to the ammonia plasma, the elemental analysis of the elements existing on the surface is performed. At this time, the result shown in FIG. 12 has been derived. According to FIG. 12, an amount of the fluorine can be reduced to 20% rather than the case shown in FIG. 5. An amount of the fluorine on the surface of the copper wiring 10 is examined, therefore such amount of the fluorine is 3.9 atom %. Also, if the surfaces are compared mutually by using spectra that are calculated by differentiating the number of Auger electrons obtained by the Auger electron spectroscopy by the energy of the electron, an amount of the fluorine on the surface is smaller than an amount of the oxygen on the surface. In addition, a distribution of the fluorine in the copper wiring 10 in the depth direction after the copper wiring 10 is subjected to the argon sputter process and the ammonia plasma process is examined, the result shown in FIG. 13 is derived. The fluorine is present up to a depth of about 10 nm, but an amount of such fluorine is extremely small.

Next, as shown in FIG. 3D and FIG. 3E, the first copper film 9 is polished by the slurry A, then the copper wiring 10 is formed in the wiring trench 7 by polishing the first tantalum nitride film using the slurry B, and then the surface of the copper wiring 10 is polished by using the slurry A. Then, as described above, the silicon nitride film 11 and the SiOF film 12 are formed on the copper wiring 10, then the holes 12a and the pad trench 12b are formed in the SiOF film 12 and the silicon nitride film 11, and then the plugs 15, the pad 16, the silicon nitride film 17, and the cover films 18, 19 are formed sequentially. At this time, the plugs are not lifted from the copper wiring 10 and thus the ideal sectional shape can be obtained. When the surfaces of the pad 16 and the copper wiring 10 are checked after the second cover film 19 is formed, the planar shape similar to FIG. 11 appears and the upper surface of the pad 16 becomes a flat surface, and thus the normal state can be achieved.

Figure 14:
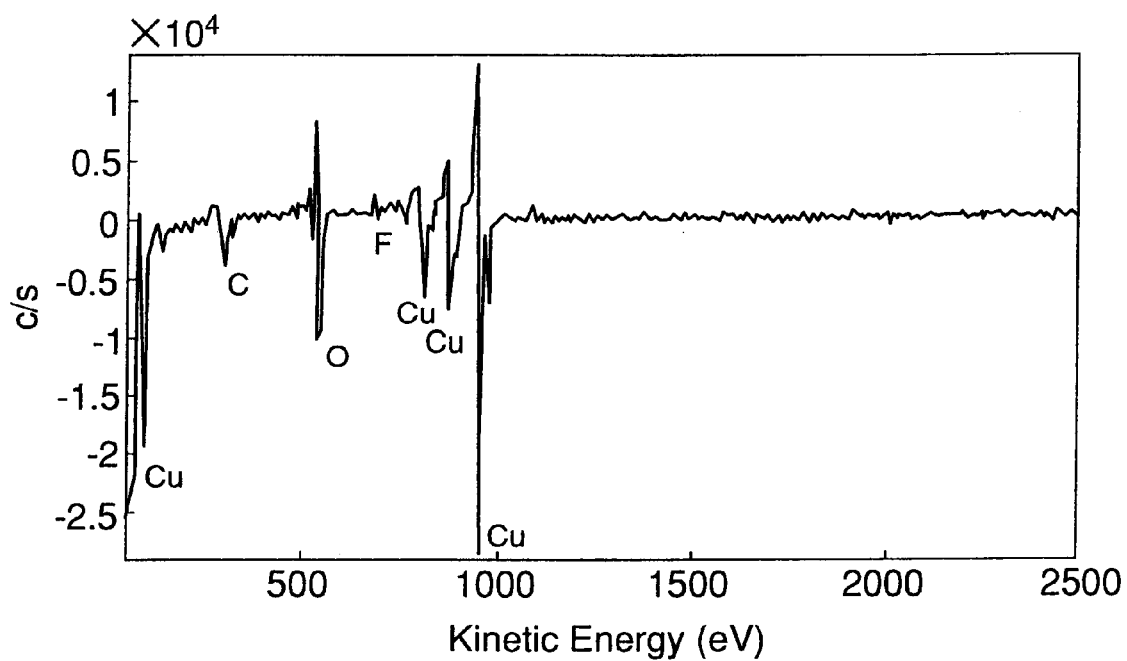
FIG. 14 is an analysis diagram showing an element amount on the surface of the copper wiring after the copper wiring is formed in the fluorine-containing insulating film, and then the surface is re-polished.

When the elemental analysis of the elements that exist on the surface of the copper wiring 10 whose surface is re-polished, the result shown in FIG. 14 is derived. An amount of the fluorine can be reduced up to 4.5% rather than FIG. 5.

With the above, it has been confirmed that, if either the steps of sputtering the surface of the copper wiring 10 by the argon and then exposing to the ammonia plasma are employed after the copper wiring 10 is formed in the wiring trench 7 by polishing the second copper film 9 and the second tantalum nitride film 8 or the step of polishing the copper film 10 by virtue of the CMP method using the slurry A once again is employed after the copper wiring 10 is formed, the peeling-off of the copper wiring 10 from the plugs or the peeling-off of the copper wiring 10 from the second silicon nitride film 11 is not caused.

Also, in the above explanation, it is preferable that, after the copper wiring 10 is formed by polishing the first copper wiring 9 and the second tantalum nitride film 8 by means of the CMP method, an amount of the fluorine on the surface should be reduced to less than 60% of that obtained when the surface of the copper wiring 10 is merely cleaned or reduced to less than 10 atom %, more preferably, less than 20% or less than 3.9 atom %.

In addition, the argon is used in the sputtering after the copper wiring 10 is formed, but the inert gas such as helium, neon, krypton, etc. may be used. Further, a mixed gas that is formed by mixing hydrogen, for example, in the ammonia may be used as the plasma used after the sputtering, or other hydrogen compound reducing gas may be used.

(Second Embodiment)

In the first embodiment, a structure for connecting the copper pad to the copper wiring and the method of forming the same are explained. But they can be similarly applied to the connection between the underlying wiring and the overlying wiring. Therefore, such embodiment will be explained hereinafter.

Figure 15A:
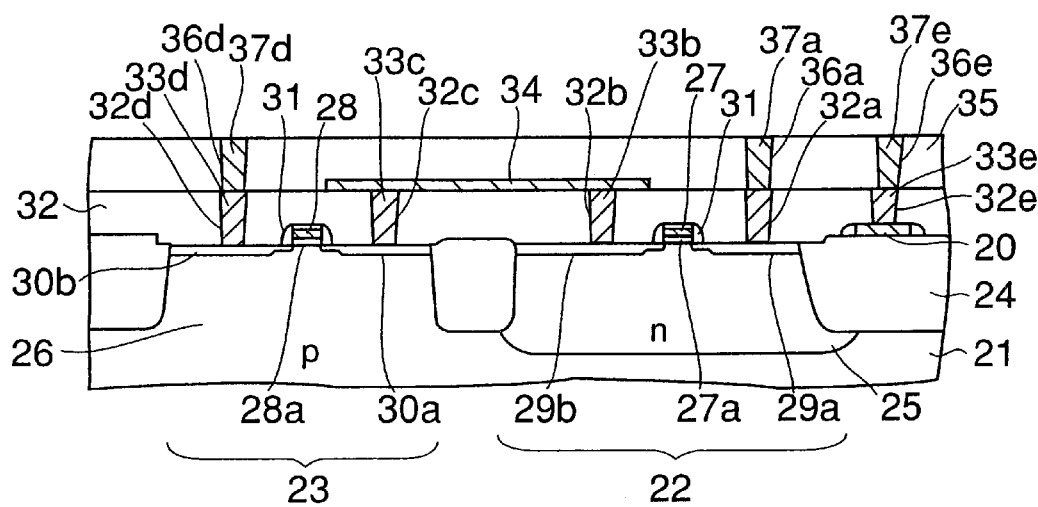
FIGS. 15A to 15I are sectional views showing steps of manufacturing a semiconductor device according to a second embodiment of the present invention.

First, steps required to get a structure shown in FIG. 15A will be explained hereunder.

A device isolation insulating film 24 having a shallow trench isolation (STI) structure is formed in a p-type silicon (semiconductor) substrate 21 to surround a first device forming region 22 and a second device forming region 23. The device isolation insulating film 24 is not limited to the STI structure, and an insulating film formed by the LOCOS method, for example, may be used.

Then, an n well 25 is formed by introducing an n-type impurity into the first device forming region 22. A region into which the n-type impurity is not introduced is a p well 26. Then, gate electrodes 27, 28 are formed on the n well 25 and the p well 26 on the silicon substrate 1 via a gate insulating film 27a and a gate insulating film 28a respectively.

Also, a first p-type impurity diffusion layer 29a and a second p-type impurity diffusion layer 29b are formed by introducing the p-type impurity into the n well 25 on both sides of the gate electrode 27, and a first n-type impurity diffusion layer 30a and a second n-type impurity diffusion layer 30b are formed by introducing the n-type impurity into the p well 26 on both sides of the gate electrode 28. In turn, insulating sidewalls 31 are formed on side surfaces of the gate electrodes 27, 28. Then, the p-type impurity is introduced into the n well 25 on both sides of the gate electrode 27 and the insulating sidewalls 31, and also the n-type impurity is introduced into the p well 26 on both sides of the gate electrode 28 and the insulating sidewalls 31. Accordingly, the p-type impurity diffusion layers 29a, 29b and the n-type impurity diffusion layers 30a, 30b have an LDD structure respectively.

A first MOS transistor consists of the p-type impurity diffusion layers 29a, 29b, the gate electrode 27, etc. in the n well 25. Also, a second MOS transistor consists of the p-type impurity diffusion layers 30a, 30b, the gate electrode 28, etc. in the p well 26.

An underlying wiring 20 is formed on the device isolation insulating film 24.

In turn, a first interlayer insulating film 32 for covering the first and second MOS transistors is formed on the silicon substrate 21, and then a surface of the first interlayer insulating film 32 is planarized by the CMP method. Then, contact holes 32a to 32e are formed in the first interlayer insulating film 32 on the p-type impurity diffusion layers 29a, 29b, the p-type impurity diffusion layers 30a, 30b, and the underlying wiring 20 respectively. Then, first layer first to fifth plugs 33a to 33e are buried into the contact holes 32a to 32e. The plugs 33a to 33e are formed by burying titanium, titanium nitride, and tungsten in sequence into the contact holes 32a to 32e. The titanium, the titanium nitride, and the tungsten formed on the first interlayer insulating film 32 are removed by the CMP method.

In addition, a wiring 34 that connects the third plug 3c on the first n-type impurity diffusion layer 30a and the second plug 33b on the p-type impurity diffusion layer 29b is formed on the first interlayer insulating film 32.

In turn, a second interlayer insulating film 35 is formed on the first interlayer insulating film 32, then second layer contact holes 36a, 36d, 36e are formed at positions to overlap with the first plug 32a on the first p-type impurity diffusion layers 29a, the fourth plug 33d on the second n-type impurity diffusion layer 30b, and the underlying wiring 20 respectively, and then second layer first and second plugs 37a, 37d, 37e are formed in these contact holes 36a, 36d, 36e. The second layer first and second plugs 37a, 37d, 37e are formed of a metal film that has the same structure as the first layer plugs 33a to 33e.

Figure 15B:
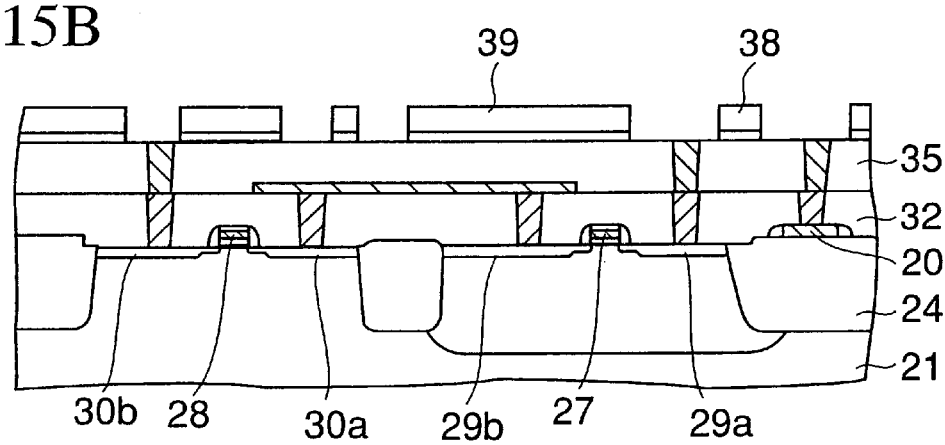

Next, steps required to get a structure shown in FIG. 15B will be explained hereunder.

First, a first silicon nitride ($Si_3N_4$) film 38 is formed on the second layer first and second plugs 37a, 37d and the second interlayer insulating film 35 by the CVD method. Also, a first SiOF film (fluorine-containing insulating film) 39 is formed on the first silicon nitride film 38 by the CVD method.

Then, first to fifth wiring trenches 38a to 38e are formed by patterning the first SiOF film 39 and the first silicon nitride film 38 by virtue of the photolithography method. The first, second and fifth wiring trenches 38a, 38d, 38e are formed at positions to partially overlap with the second layer first to third plugs 37a, 37d, 37e.

Figure 15C:
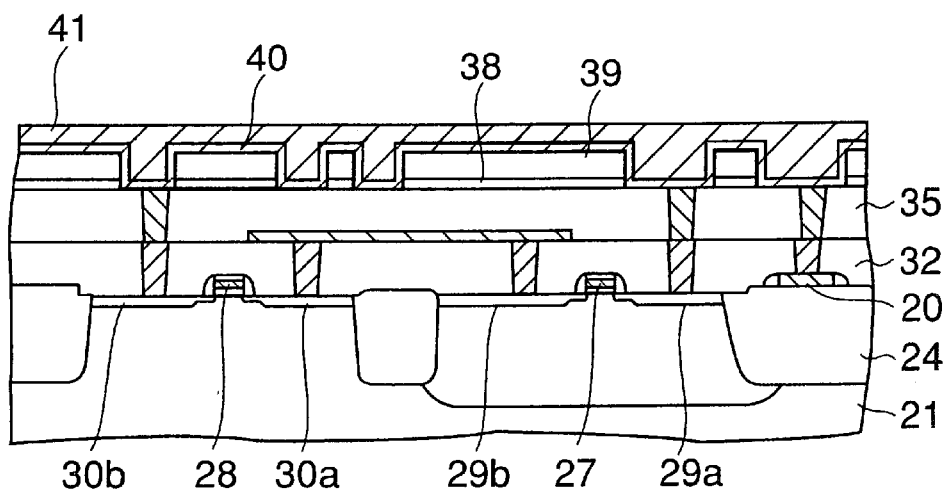

Then, as shown in FIG. 15C, a first tantalum nitride (TaN) film 40 is formed on inner surfaces of the first to fifth wiring trenches 38a to 38e and the first SiOF film 39. Then, a first copper film 41 having a thickness that can bury perfectly the wiring trenches 38a to 38e is formed on the first tantalum nitride film 40 by the electrolytic plating method.

Figure 15D:
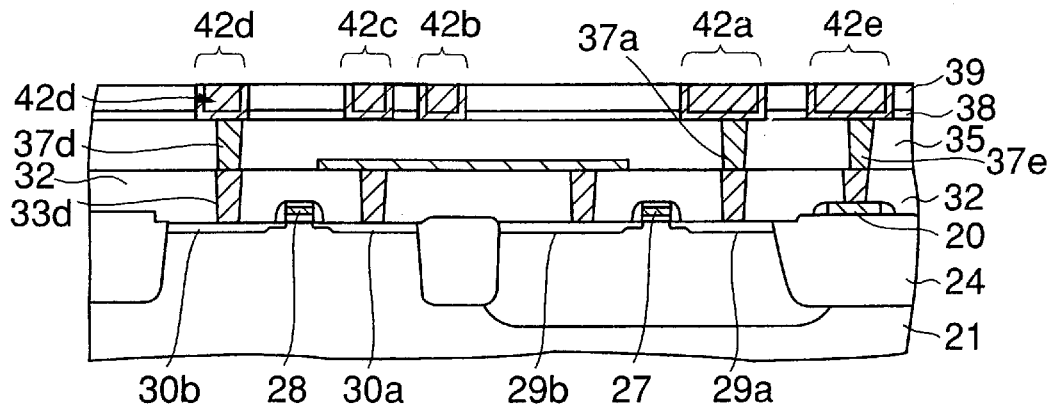

Then, as shown in FIG. 15D, the first copper film 41 is polished by means of CMP method using the slurry A to leave only in the first to fifth wiring trenches 38a to 38e, then the first tantalum nitride film 40 is polished by the CMP method using the slurry B to remove from the upper surface of the first SiOF film 39. In polishing the first tantalum nitride film 40, the surface of the first SiOF film 39 is also polished slightly and thus the fluorine (F) contained in the first SiOF film 39 is stuck onto the surface of the first copper film 41.

The first copper film 41 being left in the first to fifth wiring trenches 38a to 38e by such CMP method is used as first layer copper wirings 42a to 42e.

Then, after the CMP step using the slurry B is finished, the method similar to the first embodiment is applied to remove the fluorine stuck onto the surface of the first copper film 41 being left in the first to fifth wiring trenches 38a to 38e.

In other words, the method of polishing the first copper film 41 by the CMP method using the slurry A again is applied after the first tantalum nitride film 40 is removed from the surface of the first SiOF film 39, otherwise the method of exposing the surface of the first copper film 41 to the ammonia ($NH_3$) plasma is applied after the surface of the first copper film 41 is etched by the argon sputter method.

Figure 15E:
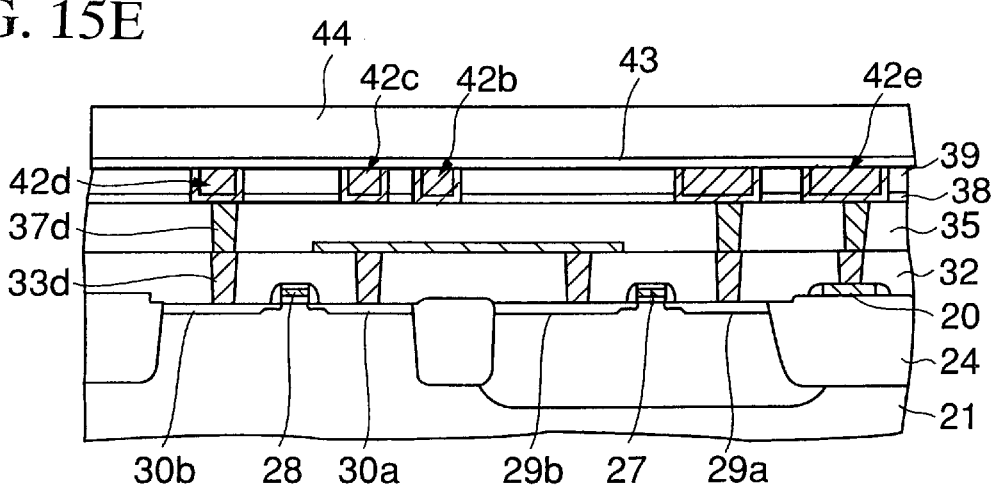

Then, as shown in FIG. 15E, a second silicon nitride film (fluorine-noncontaining insulating film) 43 is formed on the first layer copper wirings 42a to 42e and the first SiOF film 39 by the CVD method. Also, a second SiOF film (fluorine-containing insulating film) 44 is formed on the second silicon nitride film 43 by the CVD method.

Figure 15F:
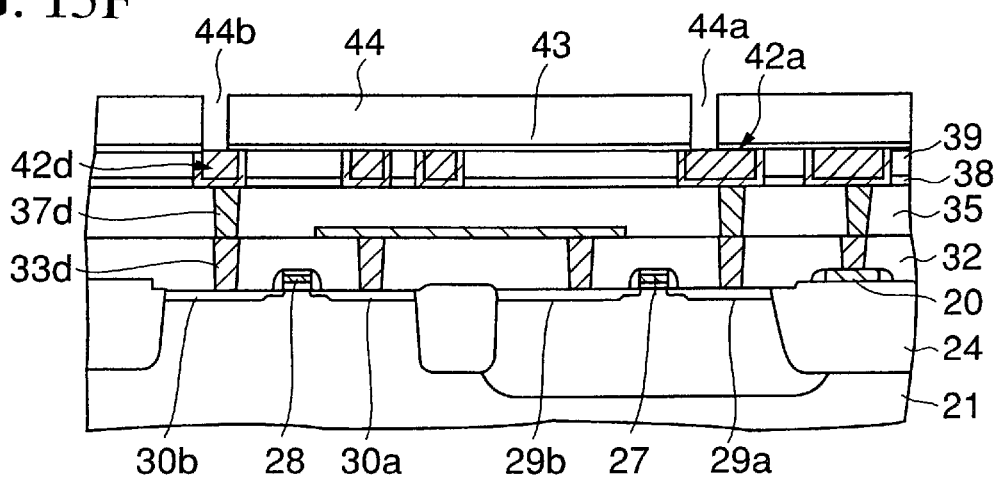

Then, as shown in FIG. 15F, holes 44a, 44b are formed on a part of the first layer copper wirings 42a to 42e by patterning the second SiOF film 44 and the second silicon nitride film 43 by means of the photolithography method.

After this, a second tantalum nitride (TaN) film 45 is formed on inner surfaces of the holes 44a, 44b and the second SiOF film 44 by the sputter method. Then, a second copper film 46 having a thickness that can perfectly bury the holes 44a, 44b is formed on the second tantalum nitride film 45 by the electrolytic plating method.

Figure 15G:
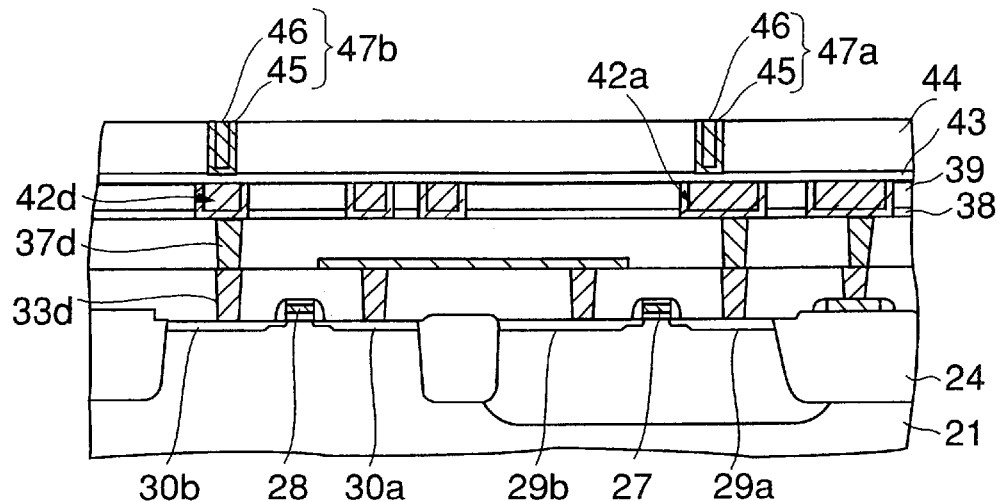

Then, as shown in FIG. 15G, the second copper film 46 is polished by the CMP method using the slurry A to leave only in the holes 44a, 44b, and then the second tantalum nitride film 45 is polished by using the slurry B to remove from the upper surface of the second SiOF film 44. In polishing the second tantalum nitride film 45, the surface of the second SiOF film 44 is also polished slightly and thus the fluorine (F) contained in the second SiOF film 44 is stuck onto the surface of the second tantalum nitride film 45. As the method of removing the fluorine on the second tantalum nitride film 45, the method of removing the fluorine from the surfaces of the first layer copper wirings 42a to 42e is similarly employed. The second tantalum nitride film 45 and the second copper film 46 left in the holes 44a, 44b are used as plugs 47a, 47b.

Figure 15H:
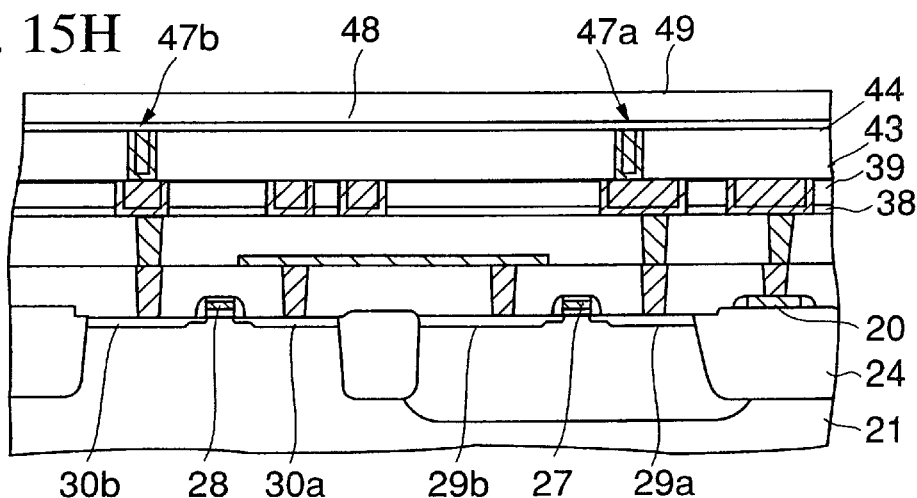

Then, as shown in FIG. 15H, a third silicon nitride ($Si_3N_4$) film 48 is formed on the second SiOF film 44 and the plugs 47a, 47b formed therein by the CVD method. Also, a third SiOF film (fluorine-containing insulating film) 49 is formed on the third silicon nitride film 48 by the CVD method.

Figure 15I:
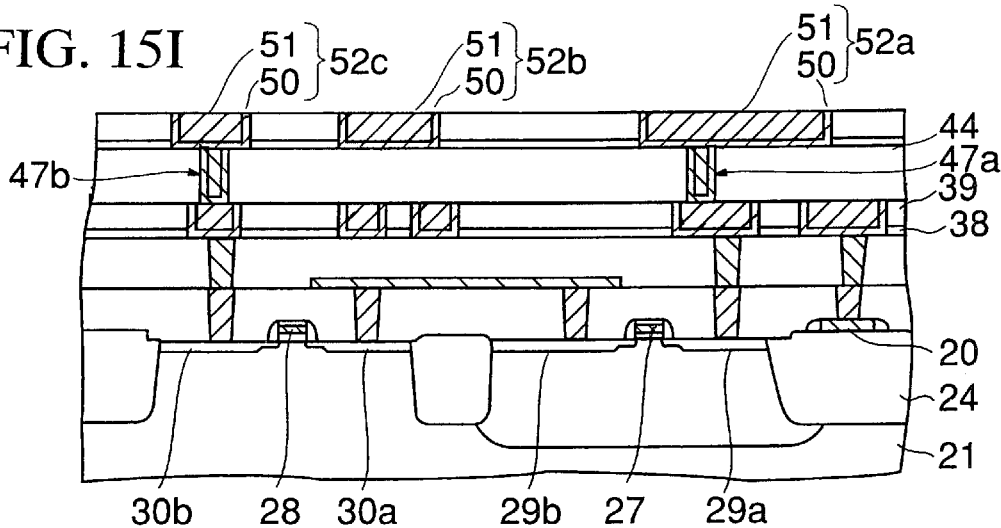

After this, as shown in FIG. 15I, second layer copper wirings 52a to 52c consisting of a third tantalum nitride film 50 and a third copper film 51 are formed in the third silicon nitride film 48 and the third SiOF film 49 by the similar method applied to the first layer copper wirings 42a to 42e. A part of the second layer copper wirings 52a to 52c is connected to the underlying plugs 47a, 47b.

In this manner, the wirings and the plugs are formed in plural repeatedly, and then the cover films (not shown) shown in the first embodiment are formed finally.

In the case where the copper wiring having the above damascene structure is employed, like the first embodiment, the peeling-off between the copper wiring and the overlying silicon nitride film can be prevented and also the peeling-off between the copper wiring and the overlying copper plugs can be prevented if the surface of the copper wiring is polished by the CMP method once again after the barrier metal film under the copper film is polished or if the argon sputter process and the ammonia plasma process are applied to the copper film after the barrier metal film is polished.

In particular, as shown in FIG. 15G, if both the plugs 47a, 47b and the silicon nitride film 43 come in contact with the copper wirings 42a, 42b, the event that the silicon nitride film 43 is peeled off from the copper wirings 42a, 42b and then the plugs 47a, 47b are substantially disconnected from the copper wirings 42a, 42b can be avoided in the second embodiment.

(Other Embodiment)

In the first and second embodiments, the explanation has been made to form the wiring having the damascene structure, the plugs, or the pad by the copper. But, the above embodiments may be also applied to the case where the wiring is formed of aluminum, or other metal in place of the copper.

Figure 16:
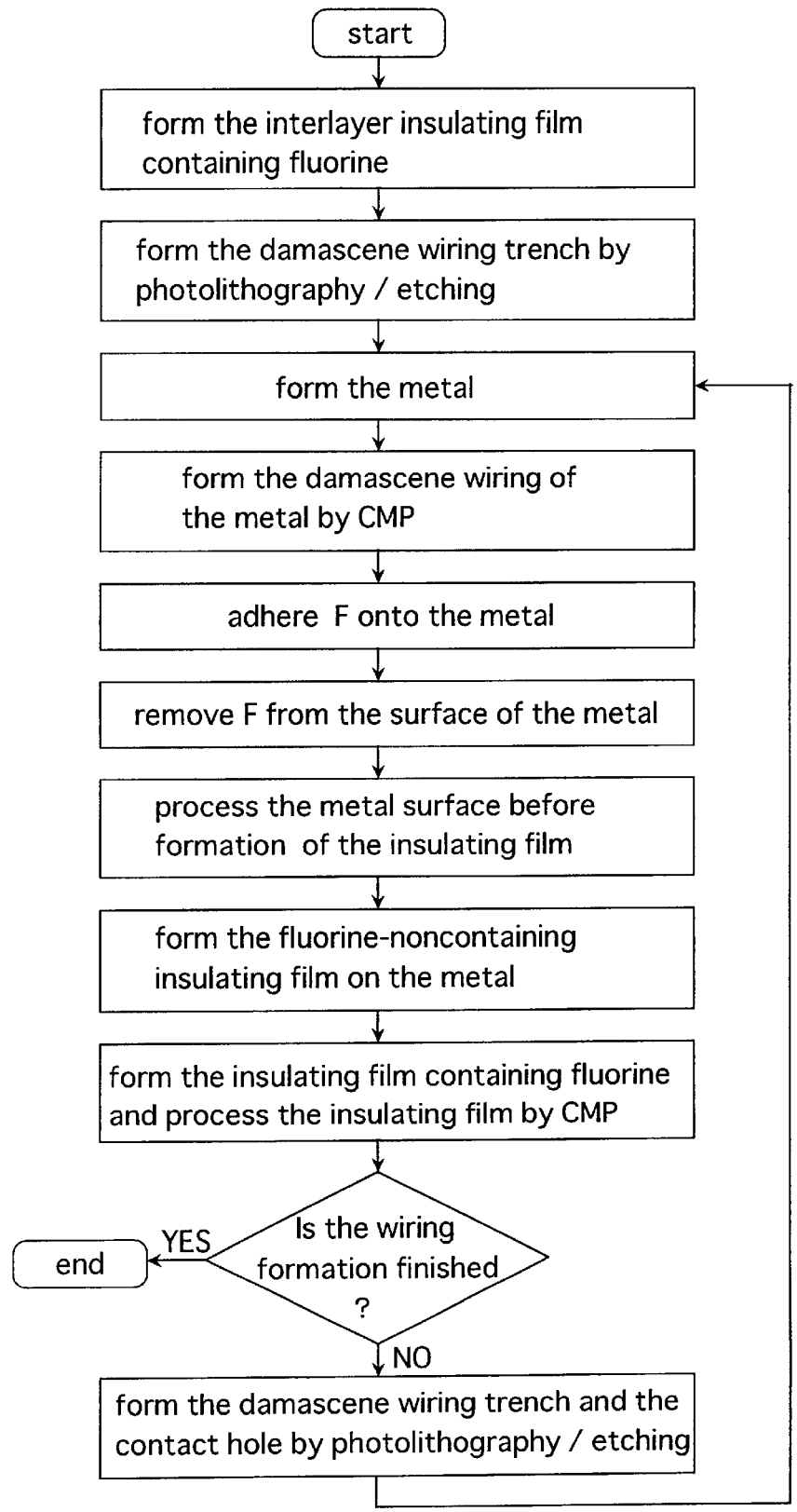
FIG. 16 is a flowchart showing steps of forming the wiring having the damascene structure in the first and second embodiments.

In this case, a process flow for forming the normal damascene structure in first and second embodiments may be shown in FIG. 16.

As described above, according to the present invention, after the trench is formed in the fluorine-containing insulating film, then the metal film is formed in the trench and the fluorine-containing insulating film and then the metal film is polished to remove from the fluorine-containing insulating film but leave in the trench, the fluorine adhered to the metal film can be reduced. Therefore, after the fluorine-noncontaining insulating film is formed on the metal film buried in the trench and then the metal plugs penetrating the fluorine-noncontaining insulating film are connected onto the metal film, the peeling-off of the fluorine-noncontaining insulating film from the metal film or the separation of the metal plugs from the metal film can be prevented.

What is claimed is:

1. A semiconductor device comprising:
    a semiconductor substrate;
    a first insulating film formed over the semiconductor substrate and containing fluorine;
    a trench formed in the first insulating film;
    a first metal wiring buried in the trench and having a fluorine concentration on an upper surface which is lower than an oxygen concentration, where the upper surface of the first metal wiring being substantially the same level as an upper surface of the first insulating film;
    a fluorine-noncontaining insulating film formed on the first metal wiring;
    a second insulating film formed on the fluorine-noncontaining insulating film;
    a hole formed at least in a lower portion of the second insulating film and the fluorine-noncontaining insulating film on the first metal wiring; and
    a metal plug buried in the hole.

2. A semiconductor device according to claim 1, further comprising:
    one of a second metal wiring and a metal pad buried at least in an upper portion of the second insulating film and connected to the first metal wiring via the metal plug.

3. A semiconductor device according to claim 1, wherein the fluorine concentration on the surface of the first metal wiring is less than 3.9 atom %.

4. A semiconductor device according to claim 1, wherein the first metal wiring has a plural-layered structure consisting of an underlying metal film and a main metal film.

5. A semiconductor device according to claim 4, wherein the main metal film is formed of a copper film.

6. A semiconductor device according to claim 1, wherein the fluorine-noncontaining insulating film is formed of a silicon nitride film or a silicon carbide film.

7. A semiconductor device comprising:
    a semiconductor substrate;
    a first insulating film formed over the semiconductor substrate and containing fluorine;
    a trench formed in the first insulating film;
    a first metal wiring buried in the trench and having a fluorine concentration on an upper surface which is less than 10 atom % where the upper surface of the first metal wiring being substantially the same level as an upper surface of the first insulating film;
    a fluorine-noncontaining insulating film formed on the first metal wiring;
    a second insulating film formed on the fluorine-noncontaining insulating film;
    a hole formed at least in a lower portion of the second insulating film and on the first metal wiring in the fluorine-noncontaining insulating film; and
    a metal plug buried in the hole.

8. A semiconductor device according to claim 7, further comprising:

one of a second metal wiring and a metal pad buried at least in an upper portion of the second insulating film and connected to the first metal wiring via the metal plug.

9. A semiconductor device according to claim 7, wherein the fluorine concentration on the surface of the first metal wiring is less than 3.9 atom %.

10. A semiconductor device according to claim 7, wherein the first metal wiring has a plural-layered structure consisting of an underlying metal film and a main metal film.

11. A semiconductor device according to claim 10, wherein the main metal film is formed of a copper film.

12. A semiconductor device according to claim 7, wherein the fluorine-noncontaining insulating film is formed of a silicon nitride film or a silicon carbide film.

13. A semiconductor device manufacturing method comprising the steps of:

forming a first fluorine-containing insulating film over a semiconductor substrate;

forming a trench in the first fluorine-containing insulating film;

forming a first metal film in the trench and on the first fluorine-containing insulating film;

leaving the first metal film in the trench and removing the first metal film from an upper surface of the first fluorine-containing insulating film, by polishing the first metal film;

reducing an amount of fluorine adhered to a polished surface of the first metal film being left in the trench; and forming a fluorine-noncontaining insulating film on the first metal film in the trench and the first fluorine-containing insulating film.

14. A semiconductor device manufacturing method according to claim 13, wherein the step of reducing the amount of fluorine adhered to the surface of the first metal film being left in the trench, including the steps of, sputtering a surface of the first metal film in the trench, and exposing the surface to a reducing gas plasma.

15. A semiconductor device manufacturing method according to claim 13, wherein the step of reducing the amount of fluorine adhered to the surface of the first metal film being left in the trench, is the step of re-polishing by changing conditions after the metal film is removed from an upper surface of the first fluorine-containing insulating film by polishing.

16. A semiconductor device manufacturing method according to claim 13, wherein the first metal wiring is formed as a plural-layered structure consisting of an underlying metal film and an overlying main metal film.

17. A semiconductor device manufacturing method according to claim 16, further comprising the step of:

removing the underlying metal film from an upper surface of the first fluorine-containing insulating film by polishing the underlying metal film while changing conditions after the main metal film is left in the trench by polishing.

18. A semiconductor device manufacturing method according to claim 16, wherein the main metal film is formed of a copper film, and the underlying metal film is formed of a metal nitride film.

19. A semiconductor device manufacturing method according to claim 13, wherein, after an amount of the fluorine that is adhered onto the surface of the first metal film in the trench is reduced, an amount of the fluorine on the surface is set lower than an oxygen concentration on the surface of the first metal film.

20. A semiconductor device manufacturing method according to claim 13, wherein, after an amount of the fluorine that is adhered onto the surface of the first metal film in the trench is reduced, an amount of the fluorine on the surface is less than 3.9 atom %.

21. A semiconductor device manufacturing method according to claim 13, further comprising the steps of:

forming a second fluorine-containing insulating film on the fluorine-noncontaining insulating film;

forming a hole in the second fluorine-containing insulating film and the fluorine-noncontaining insulating film over the first metal wiring; and forming a metal plug in the hole.

22. A semiconductor device manufacturing method according to claim 21, further comprising the steps of:

forming an upper trench, that is connected to the metal plug, in an upper portion of the second fluorine-containing insulating film; and forming one of a metal wiring and a metal pad to be buried in the upper trench.

23. A semiconductor device manufacturing method according to claim 22, wherein the metal wiring or the metal pad and the metal plug are formed by burying simultaneously a second metal film in the holes and the upper trench, and then removing the second metal film from an upper surface of the second fluorine-containing insulating film by polishing the second metal film.

* * * * *